United States Patent

[11] 3,624,642

[72] Inventor Robert W. Tripp
Tuckahoe, N.Y.
[21] Appl. No. 854,816
[22] Filed Sept. 3, 1969
[45] Patented Nov. 30, 1971
[73] Assignee Inductosyn Corporation
New York, N.Y.
Continuation-in-part of application Ser. No. 645,161, June 12, 1967, now Patent No. 3,514,775, dated May 26, 1970, Continuation-in-part of application Ser. No. 739,579, May 14, 1968, now abandoned. This application Sept. 3, 1969, Ser. No. 854,816

[54] DIGITAL AND ANALOG CONVERTER
19 Claims, 12 Drawing Figs.

[52] U.S. Cl. 340/347 AD, 235/150.5, 318/656, 318/569, 318/608, 318/660, 340/347 DA, 235/151.11
[51] Int. Cl. H03k 13/02
[50] Field of Search 340/347; 235/154, 150.5, 151.11; 318/569, 608, 660, 656–661

[56] References Cited
UNITED STATES PATENTS

| | | | |
|---|---|---|---|
| 3,349,230 | 10/1967 | Hartwell et al. | 235/154 |
| 3,469,257 | 9/1969 | Hoernes et al. | 340/347 |
| 3,488,653 | 1/1970 | Rasche | 340/347 |
| 3,531,800 | 9/1970 | Brescia | 340/347 |

*Primary Examiner*—Maynard R. Wilbur
*Assistant Examiner*—Charles D. Miller
*Attorneys*—William E. Beatty and David E. Lovejoy

ABSTRACT: A digital and analog converter incorporating a counter adapted to count repetitively through N counts, a register-counter storing a digital number $n$, and means cooperating therewith for producing first and second trains of pulses symmetrically spaced about a reference phase of the counter cycle. A first gate, operated by pulses of the two trains, and a second gate, operated by delayed pulses of the two trains, each produce analog signals having pulse widths representative of trigonometric functions of an angle $\theta=2\pi n/N$.

The digital and analog converter may be used in a position control system to supply trigonometrically related signals to a position-measuring device having relatively movable, inductively related elements. The measuring device produces an error signal, depending on the relative displacement of the inductively related elements as compared with the angle represented by the trigonometric signals. The error signal causes the register-counter to operate and to change the production of the trigonometrically related signals in a direction reducing the error signal to a small value. The count developed in the register-counter constitutes a digital indication of the relative position of the measuring device elements. Alternatively, the error current may be used in a servosystem to drive the measuring device elements to a command position specified by a digital number $n$ supplied to the system.

INVENTOR
ROBERT W. TRIPP
BY W. G. Beatty
David E. Lovejoy
ATTORNEYS.

INVENTOR
ROBERT W. TRIPP
BY
W.C. Beatty
David E. Lovejoy
ATTORNEYS.

INVENTOR
ROBERT W. TRIPP
BY
W. E. Beatty
David E. Lovejoy
ATTORNEYS.

INVENTOR
ROBERT W. TRIPP
BY W E Beatty
David E. Lovejoy
ATTORNEYS.

INVENTOR
ROBERT W. TRIPP
BY
W. E. Beatty
David E. Lovejoy
ATTORNEYS.

INVENTOR
ROBERT W. TRIPP
BY W. C. Beatty
David E. Lovejoy ATTORNEYS.

INVENTOR
ROBERT W. TRIPP
BY W. C. Beatty
David F. Lovejoy
ATTORNEYS.

INVENTOR
ROBERT W. TRIPP
BY W. E. Beatty
David E. Lovejoy
ATTORNEYS

INVENTOR
ROBERT W. TRIPP
BY W. C. Beatty
David E. Lovejoy
ATTORNEYS.

PATENTED NOV 30 1971

SHEET 10 OF 10

3,624,642

INVENTOR
ROBERT W. TRIPP

BY W. G. Beatty
David E. Lovejoy
ATTORNEYS.

DIGITAL AND ANALOG CONVERTER

CROSS-REFERENCE TO RELATED APPLICATIONS

The present application is a continuation-in-part of copending U.S. application Ser. No. 645,616, filed June 12, 1967, and entitled "Digital-to-Analog Converter," now U.S. Pat. No. 3,514,775, filed May 26, 1970. The application also is a continuation-in-part of U.S. APPLICATION Ser. No. 739,579, filed May 14, 1968, now abandoned, and of U.S. application Ser. No. 809,533, filed Mar. 24, 1969, both entitled "Position Measuring System."

BACKGROUND OF THE INVENTION

1. Field of the Invention

The present invention relates to apparatus for converting data between digital and analog forms. The invention also relates to a position control system incorporating a digital and analog converter, a position-measuring device supplying an error signal depending on a comparison of the relative displacement of the position-measuring device elements with an input of trigonometrically related signals from the digital and analog converter, and means for changing the production of the trigonometrically related signals in response to the error signal.

2. Description of the Prior Art

In automatic machine tool equipments, the position of relatively movable machine members often is measured using a resolver or other linear or rotary multipole position-measuring transformer. A particularly useful type of position-measuring transformer is that marketed under the registered trademark "Inductosyn" and described, for example, in U.S. Pat. No. 2,799,835. Such a device includes on one member, advantageously the relatively movable one, two windings in space quadrature of the pole cycle of the resolver, and on the other member, advantageously the relatively stationary one, a single winding inductively related to the space quadrature winding.

As described in the cited patent, the two "Inductosyn" space quadrature windings are energized with trigonometrically related signals, typically sine and cosine representations of an angle $\theta$, supplied by an appropriate function generator. The trigonometrically related signals are of constant phase, each comprising either a rectangular wave having a pulse width proportional to $\theta$, or a sinusoid having an amplitude representing the angle $\theta$. When the space quadrature windings are so energized, an error signal is induced in the relatively stationary member of the "Inductosyn," the magnitude of the error signal depending on a comparison of the relative displacement of the measuring transformer elements with the angle $\theta$ represented by the input trigonometrically related signals.

Various forms of digital-to-analog converters useful for supplying trigonometrically related signals are set forth in the copending U.S. application, Ser. No. 645,161, entitled "-Digital-to-Analog Converter." The converters described therein utilize a counter adapted to count repetitively through N counts, and a register adapted to store a digital number $n$ between zero and N. Two coincidence detectors, cooperating with the counter and register, generate first and second pulse trains which are symmetrically spaced about a reference position cyclically recurring every 360°. Typically, the pulses of the first train each lead by an angle $\theta=2\pi n/N$ degrees a reference count of the counter, while each pulse of the second train lags by $\theta$ degrees the same cyclically recurring reference count. By using pulses of the first and second trains respectively to close and open a gate, the output of the gate consists of a rectangular wave signal of constant phase, having a pulse width proportional to sine $\theta$.

A second trigonometrically related signal, typically representing cosine $\theta$, may be generated by using third and fourth coincidence detectors, cooperating with the counter and register, to produce third and fourth pulse trains. Typically, each pulse of the third train leads the cyclically recurring reference count by an angle $\theta+90°$, while each pulse of the fourth train lags the reference count by the same angle $\theta+90°$. These third and fourth pulse trains operate a second gate to produce a second rectangular wave signal of constant phase, having a pulse width proportional to cosine $\theta$.

As also shown in the cited U.S. application Ser. No. 645,161, both sine and cosine signals can be generated using only two coincidence detectors if the sine signal is generated by a gate and the cosine signal by a summing device appropriately combining the $\pm\theta°$ pulse trains.

While the digital-to-analog converters described in U.S. application Ser. No. 645,161, are quite useful, they have two shortcomings. First, if both sine and cosine are produced by gating, which technique requires less complex circuitry than does the summing technique, four coincidence detectors must be employed. Alternatively, if both sine and cosine signals are generated from the same two pulse trains, thus necessitating only two coincidence detectors, one of the two trigonometrically related signals is generated by the gating technique, the other by the summing technique. This results in a different amplitude scale factor between sine and cosine signals, compensation for which requires additional circuitry. Further, still more circuitry is required to insure that both sine and cosine signals are symmetrically spaced about the same reference phase.

These shortcomings are overcome by the present invention, in one of its aspects, there being provided a digital and analog converter in which both sine and cosine signals are generated by the gating technique, and yet requiring only two coincidence detectors. Further, both trigonometrically related signals are symmetrically spaced about the same reference phase. Moreover, since the sine and cosine signals both are derived from the same pair of pulse trains, phase shifts in the system affect all pulses in a like manner, and therefore do not change the relationship between the sine and cosine signals generated.

This improved digital and analog converter is incorporated in the systems set forth in copending U.S. applications Ser. No. 739,579, filed May 14, 1968, and Ser. No. 809,533, filed Mar. 24, 1969, each entitled "Position-Measuring System."

Also described but not claimed in the above cited copending U.S. application Ser. No. 645,161, is a position control and readout system wherein a digital-to-analog converter is used in conjunction with a position-measuring transformer to measure and read out the relative displacement of the movable transformer elements. Alternatively, the system may be used to drive the movable transformer elements to a command position. FIGS. 9 and 10 of U.S. application Ser. No. 645,161, and those portions of the specification which describe the position control and readout system shown therein, hereby are incorporated by reference.

Another aspect of the present invention, also representing an improvement over the prior art, is the use of the above-described described digital and analog converter to provide trigonometrically related signals to a position-measuring transformer in a position control system. Such a system, described extensively hereinbelow in conjunction with FIG. 7, utilizes the error signal from the position-measuring transformer to operate the register-counter in the digital and analog converter. As the contents of the register-counter change, the values of the trigonometrically related signals change correspondingly in a direction tending to reduce the error signal to a small value. The resultant digital number developed in the register-counter indicates the relative displacement of the measuring transformer elements, however assumed or imposed.

Further, the inventive combination uniquely provides a system for pulse and number conversion. For example, the system will accept a digital number $n$, in serial or parallel form, either straight binary or binary-coded decimal, and convert this number to an analog signal indicative of $n$. Further, the system will accept a train of pulses and produce an analog signal indicative of the number of pulses accepted. In another mode of operation, the system will drive the relatively movable members of a machine to a position specified by a digital input number $n$, or will move the machine member through an incremental distance for each pulse of a pulse train provided to the system.

Alternatively, the system will develop a digital number $n$ indicative of the position, however assumed or imposed, of the relatively movable elements of a position-measuring device. This number $n$ is available in either serial or parallel form for external utilization. Further, the system will provide a train of output pulses, each pulse representing motion of the measuring device elements through an increment of distance.

SUMMARY OF THE INVENTION

In accordance with one aspect of the present invention, there is provided a unique digital and analog converter. Typically, the converter accepts a digital number $n$ and provides analog signals which are trigonometrically related to $n$.

In a preferred embodiment, the converter comprises a counter adapted to count repetitively through N counts, and a register-counter adapted to store a digital number $n$ between 0 and N. A first coincidence detector compares the contents of the counter with the contents of the register-counter so as to provide a first train of pulses, each pulse leading by $\theta=2\pi n/N$ radians a reference phase cyclically recurring every 360°. A translator provides an output which is a function of the complement of the contents of the register-counter. A second coincidence detector compares the translator output with the contents of the counter to provide a second train of pulses, each pulse lagging by $\theta°$ the same cyclically recurring reference phase.

First and second counters each repetitively count through a range of M counts to produce respective first and second square waves. The counters are reset by pulses of the first and second trains respectively, thereby establishing a phase difference between the square waves. A first gate combines the first and second square wave signals to produce an output rectangular wave signal having a pulse width proportional to a first trigonometric function of the angle $\theta$. The square waves also are appropriately delayed and combined in a second gate to produce another rectangular wave signal having a pulse width proportional to a second trigonometric function of the angle $\theta$.

In one embodiment of the digital and analog converter, the counter and register-counter each are binary-coded decimal (BCD) devices, and the translator output represents the nine's complement of the BCD contents of the register-counter. The coincidence detectors are adapted to provide pulses indicative of coincidence in each decimal digit of the BCD data being compared. Certain of these digit coincidence pulses occur at a rate MF and are used to advance the counters of length M.

In accordance with another aspect of the present invention, there is provided a position control system incorporating a digital and analog converter and a resolver or position-measuring transformer, preferably of the type described in U.S. Pat. No. 2,799,835. The position-measuring device receives trigonometrically related signals from the digital and analog converter, and provides an error signal depending on a comparison of the relative displacement of the measuring device elements with the angle represented by the trigonometric signals. In certain operational modes, this error signal is used by the digital and analog converter to change the production of the trigonometrically related signals in a direction tending to reduce the error signal to a small value.

In a preferred embodiment, the error signal from the position-measuring device is used to control generation of count pulses (herein designated RCT), one RCT pulse being produced for each cycle of the error signal. The RCT pulses either increment or decrement the register-counter in the analog and digital converter, in accordance with the sign of the error signal, so as to change correspondingly the values of the trigonometrically related signals in a direction which minimizes the error signal. The resultant count developed in the register-counter provides a digital indication of the relative position of the measuring device elements. This digital count also is available externally, in either serial or parallel form. Further, each RCT pulse represents motion of the position-measuring device through an increment of distance; the RCT pulses also are available as a system output.

In an alternative mode of operation, the error signal from the position-measuring device operates a servosystem for driving relatively movable members to a command position specified by a digital number $n$ supplied to the register-counter. Alternatively, the register-counter may be incremented or decremented by externally supplied unit advance pulses, thereby causing the relatively movable members to be displaced through an increment of distance for each pulse received, in a direction determined by an externally supplied up-down control signal.

Thus, it is an object of the present invention to provide an improved digital and analog converter.

Another object of the present invention is to provide an apparatus for converting a digital number $n$ to which there corresponds an angle $\theta=2\pi n/N$ degrees, wherein N is a constant, into analog signals indicative of $n$.

It is another object of the present invention to provide a digital and analog converter wherein analog signals representing two trigonometric functions of an angle $\theta$ both are generated by the gating technique from a pair of pulse trains respectively leading and lagging a cyclically recurring reference phase by $\theta°$.

Yet another object of the present invention is to provide a position control system incorporating a generator supplying trigonometrically related signals to a position-measuring transformer, the transformer providing an error signal depending on a comparison of the relative displacement of inductively related elements with the angle represented by the trigonometric signals, the error signal changing the production of trigonometrically related signals in a direction reducing the error signal to a small value.

It is yet another object of the present invention to provide a position control system incorporating (a) a digital and analog converter of the type described and including a register-counter, and (b) a position-measuring transformer supplying an error signal which is used to change the contents of the register-counter so as to develop therein a digital number indicative of the relative displacement of the inductively related elements of the transformer.

It is another object of the present invention to provide a position control system for driving the relatively movable members of a machine either to a command position specified by an input digital number $n$, or through an increment of distance for each pulse of a set of pulses serially supplied to the system.

A further object of the present invention is to provide apparatus for converting data between pulse, digital and analog forms.

BRIEF DESCRIPTION OF THE DRAWINGS

Still other objects, features and attendant advantages of the present invention will become apparent to those skilled in the art from a reading of the following detailed description of the preferred embodiments constructed in accordance therewith, taken in conjunction with the accompanying drawings wherein like numerals designate like parts in the several figures and wherein:

In FIG. 3, waveform *a* represents the counting cycle of a counter employed in the digital-to-analog converter; waveform *b* illustrates a square wave reference signal derived from the counter cycle; and waveforms *c* through *i* illustrate the rectangular wave sine and cosine output signals obtained from the function generator of FIG. 2 for various angles $\theta$.

DESCRIPTION OF THE PREFERRED EMBODIMENTS

Figure 1:
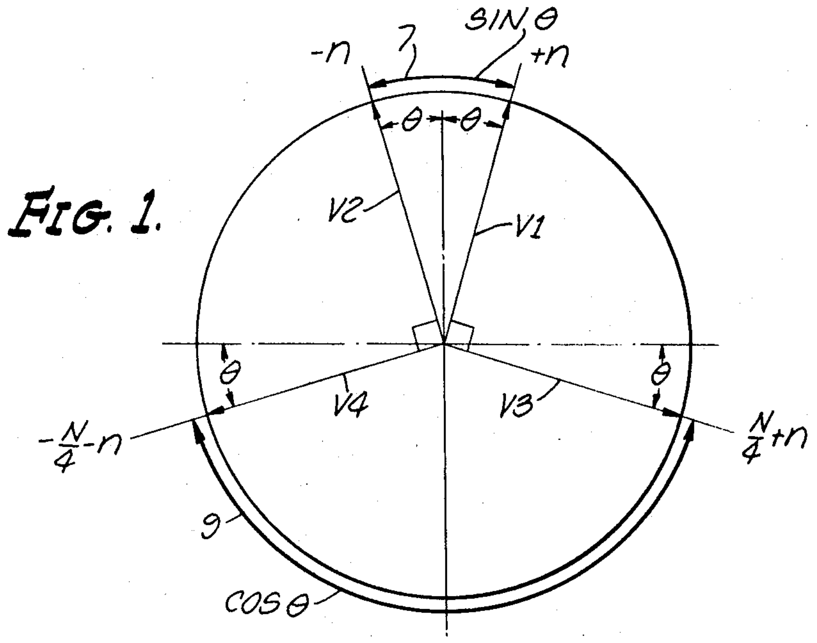
FIG. 1 is a vector diagram useful in explaining a gating technique for trigonometric function generation.

Referring now to the drawings, and particularly to FIG. 1 thereof, there is shown a vector diagram helpful in describing trigonometric function generation by the gating technique. In FIG. 1, a pair of unit amplitude vectors, V1 and V2, represent two sinusoidal oscillations, currents or voltages, of the same frequency and amplitude, leading and lagging a zero reference phase in the cycle by equal angles $\theta$. The peripheral distance or arch 7 between two vectors V1 and V2 is seen to be proportional to sin $\theta$. Two similar unit amplitude vectors, V3 and V4 are situated at the phases $\pi/2+\theta$ and $-\pi/2-\theta$ respectively. The peripheral distance or arc 9 between vectors V3 and V4 is seen to be proportional to cos $\theta$.

A cycle as indicated by the circle in FIG. 1 is identified with the time interval over which a pulse generator or clock develops a number N of equally spaced pulses. This time interval may be denoted 1/F, F being the frequency in cycles per second at which the complete count is repeated. The cycle is accordingly composed of N parts, 2,000 for example, and a number *n* ranging from 0 to N therefore defines an angle $\theta$ in degrees of arc according to the relation $\theta$/360=*n*/N. The vectors V1, V2, V3 and V4 of FIG. 1 therefore occur at the counts *n*, N−*n* (or, more simply stated, −*n*), N/4+*n* and −N/4−*an* (alternatively, 3N/4−*n*) in the cycle of the N pulses or "counts."

In accordance with one aspect of the invention described hereinbelow, separate trains of pulses are developed at the +*n* and −*n* phases of the cycle, or at the N/4+*n* and −N/4−*n* phases, or at all four phases. The first pair of pulse trains control a gate to which is applied an electrical signal of suitable form, for example a DC level, a square wave pulse train or a sinusoidal carrier. The rectangular wave signal which passes through the gate is cyclical at the frequency F, of fixed phase, and exhibits a pulse width proportional to sin $\theta$. The second pair of pulse trains similarly control another gate to provide a second rectangular wave signal, also of fixed phase, of frequency F, and exhibiting a pulse width proportional to cos $\theta$.

By passing the rectangular wave signals through a filter passing the frequency F, or by suitable phase detection against a reference signal of frequency F, output signals may be derived proportional in amplitude to sin $\theta$ for the signal generated by the pulse trains at +*n* and −*n*, and proportional in amplitude to cos $\theta$ for the signal generated by the pulse trains at N/4+*n* and −N/4−*n*.

Figure 2:
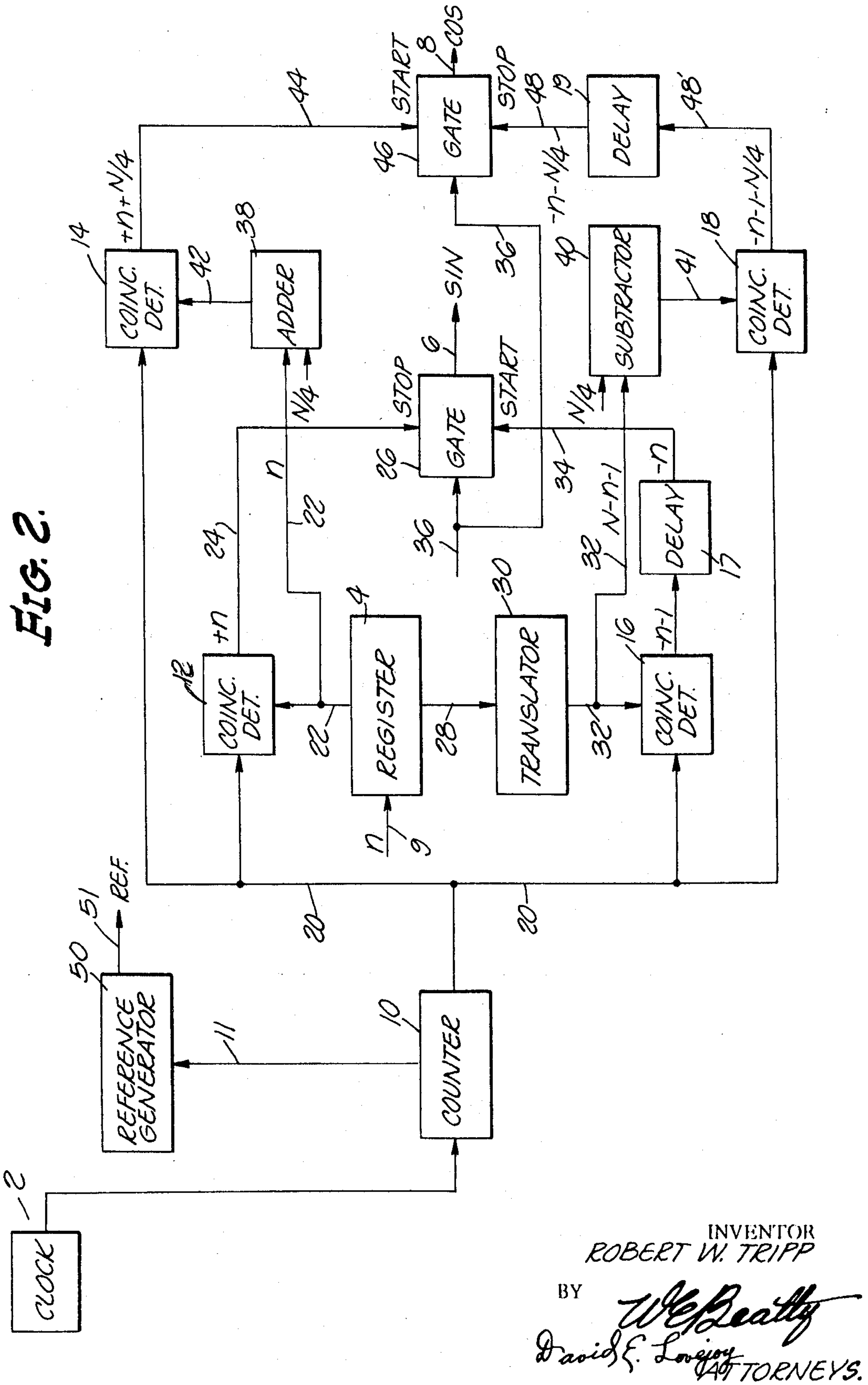
FIG. 2 is a block diagram of a function generator using the gating technique to convert a digital number $n$ to analog signals representing trigonometric functions of an angle $\theta=360n/N$ degrees, where N is a constant.

FIG. 2 is a block diagram of an embodiment of the invention which produces from the pulses of frequency NF developed in a pulse generator or clock 2 and from a number *n* between zero and N, which is stored in a register 4, signals at output channels 6 and 8 representative respectively of the sine and cosine of the angle $\theta=2\pi n$/N. For this purpose, the circuit of FIG. 2 includes a counter 10 to which the pulses of the clock 2 are continuously supplied. Counter 10 develops a count varying from zero to N−1 and then resetting to zero as indicated at waveform *a* in FIG. 3.

The changing count thus existing in the counter is supplied in parallel to four coincidence detection circuits 12, 14, 16 and 18 by means of a channel diagrammatically indicated at 20. The channel 20 includes conductors sufficient to present, in the number system adopted, the state of the count. If for example N=2,000 in decimal numbers and if a binary-coded decimal system is adopted for presentation of the count to the coincidence circuits, channel 20 may include 16 pairs of conductors, four pairs for each of the four decimal digits present in the count.

A number *n*, representative of the angle of which it is desired to generate the sine and cosine, is introduced into the register 4 in any suitable manner, manually or from a computer for example. The register presents the number *n* to coincidence detector 12 via a channel 22 which is of the same nature as channel 20. At coincidence, which occurs once on each of the cycles of frequency F and at the time of the *n'th pulse in that cycle, circuit 12 develops a pulse which is delivered by a line 24 to a gate 26. The symbol* +*n* applied to line 24 indicates that the pulse on that line occurs at the phase +*n* of the cycle 1/F, as indicated in FIG. 1.

The count stored in the register 4 also is presented via a channel 28 (similar to the channels 20 and 22) to a translator 30. The translator is a device which converts the number *n* into a number which may be either N−*n*, or, more conveniently, N−*n*−1. Suitable devices for this purpose are well known, an illustrative embodiment being described hereinbelow in conjunction with FIG. 8. By operation of translator 30, an output channel 32 therefrom, which may be similar to channels 20, 22 and 28, presents to coincidence circuit 16 the number N−*n* or N−*n*−1. Circuit 16 consequently delivers an output pulse to gate 26 over a line 34 when the counter 10 contains the count equal to the number presented to coincidence circuit 16 by translator 30. If the translation is to N−*n*−1, the output of coincidence detector 16 is a pulse at the phase −*n*−1, i.e., one pulse earlier than −*n*. This is compensated for by a delay unit 17 inserted in line 34.

The pulses delivered to gate 26 on lines 24 and 34 serve respectively to close and to open that gate so that an output signal appears on line 6 during that portion of the cycle 1/F between the phases −*n* and +*n*. The nature of this output signal depends upon the signal applied to the input terminal of the gate from a line 36. This input signal may be either a DC level, or it may be the clock pulses from the clock 2, or it may be an alternating current or voltage of some desired carrier frequency. Thus, if a continuous DC level is supplied on line 36, the signal on line 6, during the period that gate 26 is open, will be a corresponding DC level.

Consequently, the signal on the line 6 is a gated signal representative of the sine of the angle $\theta$ with $\theta=2\pi n$/N radians, as illustrated in FIG. 1 and as explained in conjunction with that figure.

The number *n* is applied by the channel 22 to an adding device 38 as well as to the coincidence detector 12 and the number N−*n*−1 is similarly applied by the channel 32 to a subtracting circuit 40 as well as to the coincidence circuit 16. Adding and subtracting circuits 38 and 40 are, like translator 30, combinations of logic which serve respectively to add and to subtract to the numbers presented to them the number N/4. Apparatus of this kind is well known in the art of digital computers.

Adding circuit 38 thus presents to coincidence detector 14 on a channel 42, which may be similar to channel 20, a static number $n$+N/4. Consequently, once per cycle of counter 10, at the count +$n$+N/4, there is delivered to an output line 44 from the circuit 14 a pulse, and this pulse is employed to open a gate 46 receiving at its input on line 36 the same signal as does gate 26.

The subtractor 40 presents to detector 18 via a channel 41 the number N—$n$—1—N/4 so that at the (N—$n$—1—N/4)'th pulse of the cycle a pulse is delivered by detector 18 on an output line 48'. For brevity, the phase of this pulse is indicated as —$n$—1—N/4 adjacent line 48' in FIG. 2. That phase being one pulse too early, a one pulse delay unit 19 is inserted in line 48 between detector 18 and gate 46. The output pulse from detector 18 on a line 48 serves to close gate 46.

In consequence, gate 46 is open from the phase +$n$+N/4 to the phase —$n$—N/4, gate 46 delivering on line 8 a signal representative of the cosine of the angle $\theta$, as illustrated in FIG. 1 and as explained in conjunction with that figure.

A reference signal generator 50 (see FIG. 2) receives from counter 10 over a channel 11 pulses at the N/4 and 3N/4 phases of the counter cycle and generates therefrom a square wave at the counter cycle frequency, displaced in phase by one quarter of the counter cycle from the counter cycle itself. Pulses at the N/4 and 3N/4 phases may be derived from the counter in various ways, for example at the coincident transitions in suitably selected plural orders of the counter. Alternatively, other methods may be employed to obtain the reference wave at the desired phase.

Figure 3:
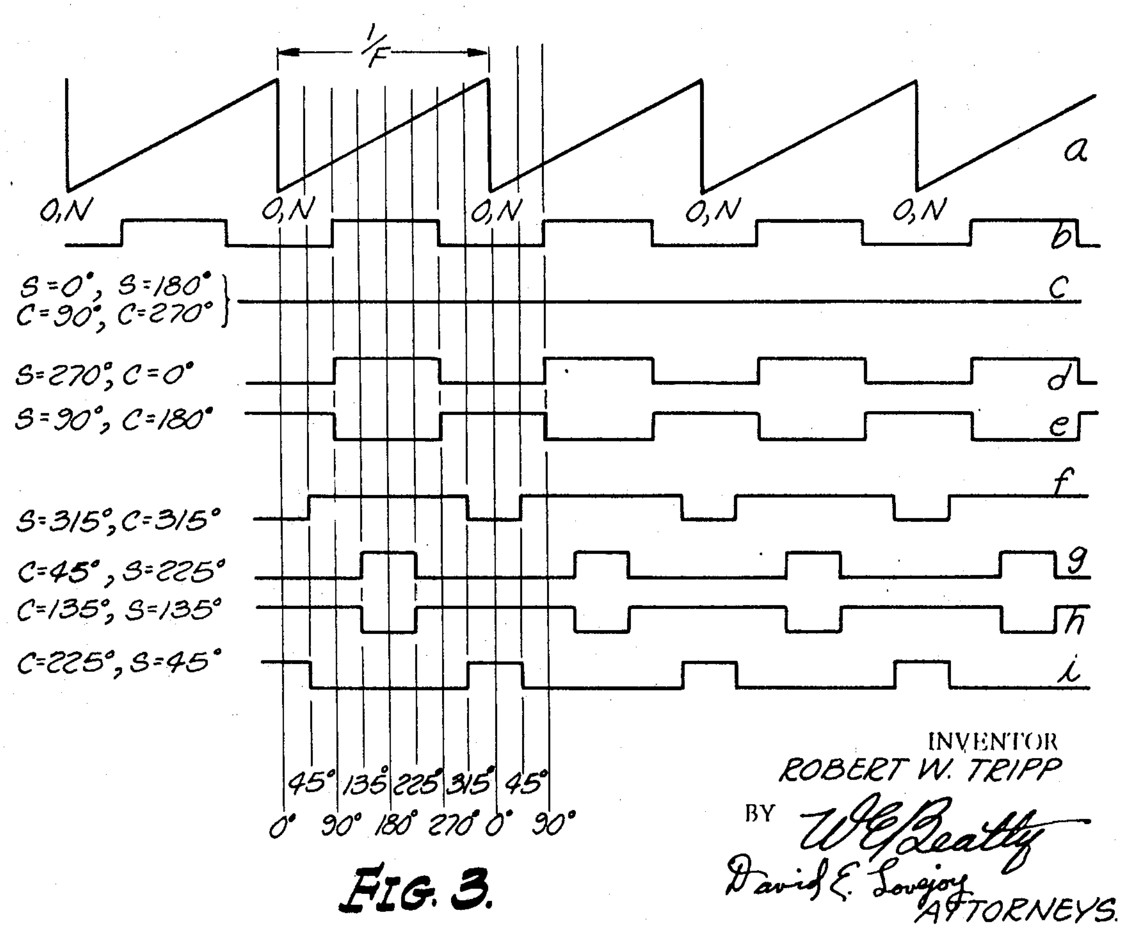
FIG. 3 is a set of waveforms useful in explaining operation of the function generator shown in FIG. 2.

Referring to FIG. 3, waveform $a$ represents the count in counter 10, increasing from 0 to N(actually to N—1) and resetting to 0 in a time interval 1/F corresponding to a cycle of 360°. Thus, if N is 2,000, the counter counts from 0 to 1,999 by means of pulses having a repetition rate 2,000 F, the 2,000th interval during the cycle being occupied in resetting 1,999 to 0. While waveform $a$ is shown as a continuous slant line, the state of the counter varies digitally.

The reference waveform output of generator 50 is shown at waveform $b$.

Waveform $c$ represents the output of sine gate 26 for 0° and 180° values of the angle $\theta$, where $\theta$=360$n$/N°. It likewise represents the output of cosine gate 46 for 90° and 270° values of $\theta$. Waveform $d$ similarly represents the output of gate 26 for $\theta$=270° and the output of gate 46 for $\theta$=0°. In similar fashion waveform $e$ represents the sine channel output at $\theta$=90° and the cosine channel output at $\theta$=180°. Waveform $f$ represents the sine channel output at $\theta$=315° and the cosine channel output at $\theta$=315°. Waveform $g$ represents the cosine channel output at $\theta$=45° and the sine channel output at $\theta$=225°. Waveform $h$ represents the cosine channel output for $\theta$=135° and the sine channel output for $\theta$=135°, while waveform $i$ represents the cosine channel output for $\theta$=225° and the sine channel output for $\theta$=45°.

Phase detection of any one of the signals of waveforms $c$ through $i$ against reference waveform $b$ will yield a signal whose component of frequency F is of amplitude and polarity proportional to the functions of the angle $\theta$ just recited, for the values of $\theta$ mentioned. Of course, $\theta$ can have any of the values permitted by $n$. The values selected are for illustration only.

Figure 4:
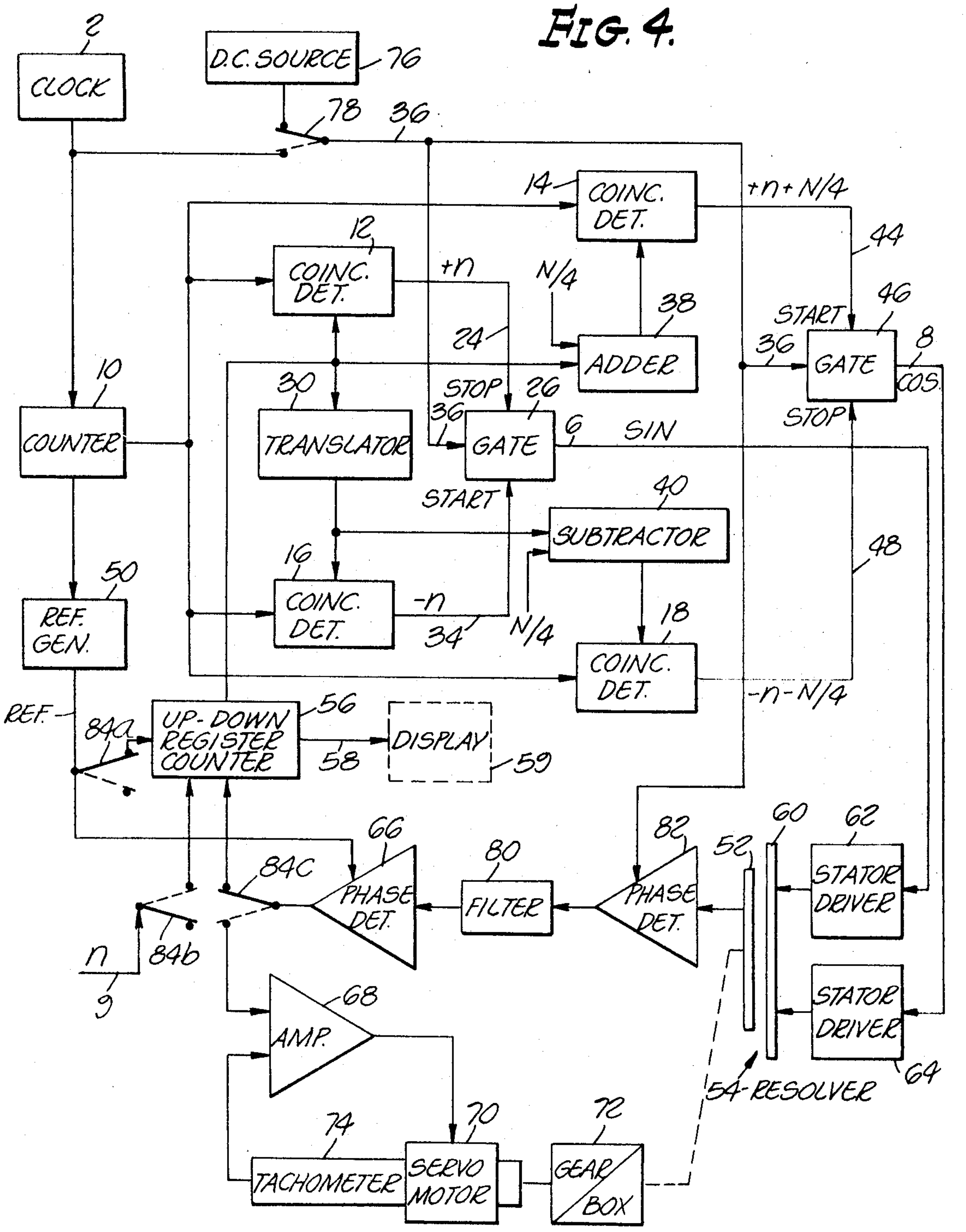
FIG. 4 is a block diagram of a digital and analog converter in accordance with the present invention and utilizing the function generator of FIG. 2.

FIG. 4 shows an embodiment of the invention which can be used either to drive the rotor or slider 52 of a resolver generally indicated at 54 to an angular position defined (within an angular cycle of the resolver which may be a fraction of 360°) by a digital number $n$ stored in a register-counter 56 or to develop in the device 56 a count constituting a digital readout of the instantaneous position of movable member 52. A signal indicative of this position readout also is available on line 58 for use by an external utilization device (not shown) such as a computer or a visual display.

The resolver advantageously may be a multipole position measuring transformer (either linear or rotary) as marketed under the registered trademark "Inductosyn" and as described, for example, in U.S. Pat. No. 2,799,835. Such a resolver includes on one member, advantageously the stator, two windings in space quadrature of the pole cycle of the resolver, as disclosed in detail in that patent. This member is indicated at 60 in FIG. 4, and the space quadrature windings thereof are energized with currents conforming to the sine- and cosine-representative signals produced in accordance with the invention. Alternatively, the movable member could be member 60 which receives the space quadrature currents, as frequently used in the case of the linear "Inductosyn."

The system of FIG. 4 includes the apparatus shown in FIG. 2, interconnected with the signal channels and lines thereof, but with register-counter 56 replacing register 4 of FIG. 2. FIG. 4 includes, in addition, the resolver 54 already mentioned, a pair of stator driver amplifiers 62 and 64, a phase detector 66, a servoamplifier 68, and a servomotor 70, which may be coupled to the movable member 52 of the resolver through a gear box 72. A tachometer 74 is shown providing control on the gain of amplifier 68.

The system of FIG. 4 also includes a DC source 76 which provides a DC signal via line 36 to gates 26 and 46 when a switch 78 is in the full line position shown. A single filter 80, adapted to pass the fundamental frequency F of the trigonometrically related signals produced by gates 26 and 46, is situated in the line between resolver 54 and phase detector 66. Alternatively, separate filters may be placed in series with line 6 and 8.

When switch 78 is in the position shown in phantom in FIG. 4, gates 26 and 46 receive as an input clock pulse from clock 2. In this instance, an additional phase detector 82 permits recovery of the modulation at frequency F to which phase detector 66 is to respond. Phase detector 82 receives the clock pulses from clock 2 as a reference for performance of the phase detection function.

Selection of whether the system of FIG. 4 is to be used to position movable member 52 of resolver 54, or to read out the position of member 52, is accomplished by means of a set of ganged switches 84$a$, 84$b$ and 84$c$, all of which occupy either the full line or the phantom positions shown therefor. When switches 84$a$, 84$b$ and 84$c$ are in the phantom position shown therefore, register-counter 56 functions as a register to store a number $n$ applied to it through switch 84$b$. The apparatus then functions in the manner described in conjunction with FIG. 2 to develop on the lines 6 and 8 voltages representative of the sine and cosine of the angle $\theta=2\pi n/N$ in the manner hereinabove described. In particular, if switch 78 connects line 36 to DC source 76, the signals on the lines 6 and 8 will be rectangular waves having the fundamental frequency F. Filter 80 serves to remove harmonics of F. Phase detector 66 then receives the net voltage induced in the winding of resolver movable member 52 and also receives the reference voltage from generator 50.

The output of phase detector 66 is a DC voltage the amplitude of which is proportional to the positional error of member 52 and the sign of which indicates the sense of that error. This error voltage operates through the servo loop shown to drive member 52 to the position at which the error voltage falls to zero.

If switch 78 is connected instead to clock 2, operation of the system is essentially the same. Filter 80 will remove not only harmonics of the fundamental frequency F but, obviously, the components at NF (the clock pulse frequency) and harmonics thereof.

When switches 84$a$, 84$b$ and 84$c$ instead are set to the full line position shown for them, the apparatus of FIG. 4 serves to provide in device 56 a count indicative of the position of movable resolver member 52, however assumed or imposed. As noted, the output signal on line 58 also is indicative of this position. The error signal output of phase detector 66 serves to shift the count in device 56 by one count per modulation cycle F, until that error voltage goes to zero. It will be seen that switch 84*a* applies the reference voltage of frequency F to device 56 thus controlling the change in count in device 56 to one count per cycle of frequency F. The count obtained in device 56 may be exhibited by a readout or display 59, shown in phantom in FIG. 4.

Figure 5:
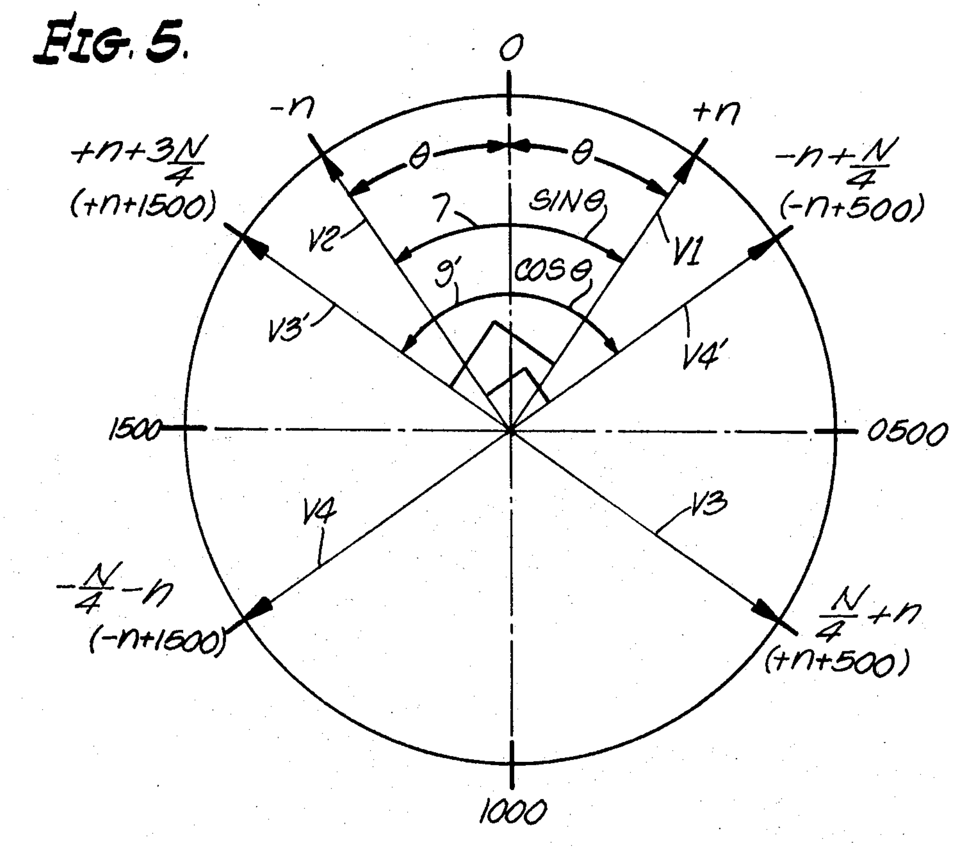
FIG. 5 is a vector diagram analogous to that of FIG. 1, and useful in explaining operation of the function generators shown in FIGS. 6 and 9.
Figure 6:
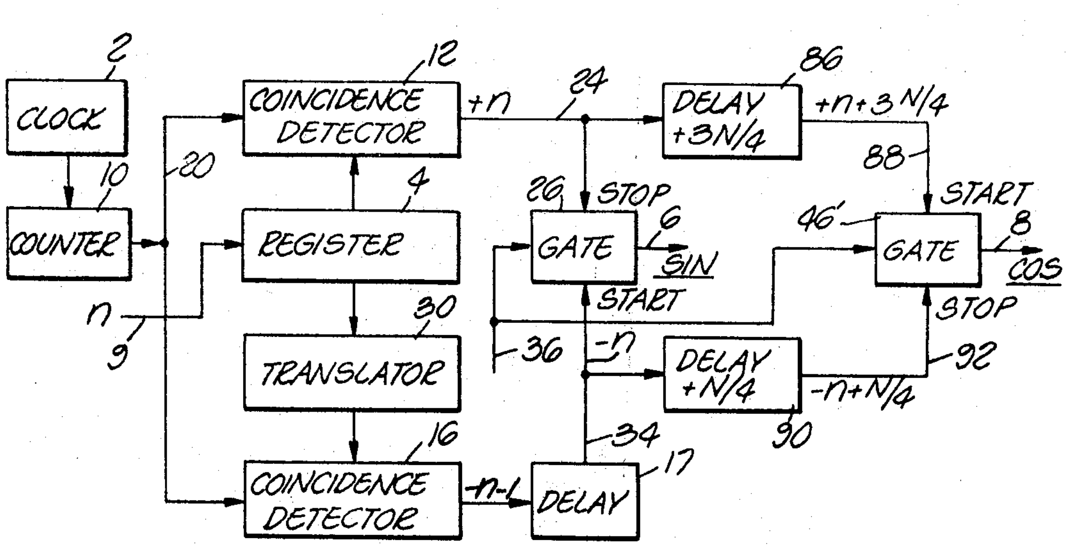
FIG. 6 is a block diagram of another embodiment of a function generator using delay and gating techniques to provide analog signals representing trigonometric functions of an angle $\theta$=360*n*/N degrees, where N is a constant and *n* is a digital number between 0 and N.

FIG. 5 is a vector diagram analogous to that of FIG. 1, and useful in understanding operation of the digital-to-analog converter embodiment of FIG. 6. Referring to FIG. 5, vectors V1, V2, V3 and V4 correspond exactly to the like designated vectors in FIG. 1. Another pair of vectors V3' and V4' extend in opposite radial directions from vectors V3 and V4, respectively. That is, vector V3' occurs at a count of $(N/4+n)+N/2=n+3N/4$. Similarly, vector V4' occurs at a count of $(-N/4-n)+N/2ax-n+N/4$. It is apparent that the peripheral distance between vectors V3' and V4' is the same as the peripheral distance between vectors V3 and V4, both being representative of cos $\theta$. In FIG. 5 the peripheral distance between vectors V3' and V4' is designated as arc 9' corresponding to arc 9 of FIG. 1.

If a gate were opened by a pulse occurring at time $+n+3N/4$ and closed by a pulse occurring at $-n+N/4$, the rectangular wave signal provided by the gate would have a pulse width proportional to cos $\theta$. As with the embodiment of FIG. 1, a rectangular wave signal having a pulse width proportional to sine $\theta$ may be generated by a gate opened by a pulse occuring at $-n$ and closed by a pulse occurring at $+n$.

Note that sine and cosine signals so generated both are symmetrically spaced about the same zero count reference point. This is in contrast to FIG. 1, wherein the sine and cosine signals are centered about respective reference phases spaced by 180°. A function generation system utilizing pulses spaced equally on both sides of the same reference point or phase is desirable for eliminating errors caused by undesirable phase shifts in the system. Such phase shifts cause all pulses to be shifted in the same direction relative to the reference phase (in the present invention). As a result, the pulse separation and, therefore, the angle represented by the generated trigonometric functions, remains unchanged.

FIG. 6 shows in block diagram form an embodiment of a digital-to-analog converter for converting a digital number $n$ to analog signals representative of trigonometrically related functions of an angle $\theta=360n/N°$, where N is a constant. The system utilizes gating techniques to generate both sine and cosine from the same pair of pulse trains. In particular, a pair of gates actuated by pulses corresponding to vectors V1, V2, V3' and V4' of FIG. 5 produce sine and cosine signals which are symmetrically spaced about the same reference point or phase.

With particular reference to FIG. 6, clock 2, register 4, sine and cosine output lines 6 and 8, counter 10, coincidence detectors 12 and 16, delay 17 and gate 26 correspond in kind and operation to the like numbered components of the apparatus of FIG. 2. Thus, an input digital number $n$ is stored in register 4, and pulses are generated on lines 24 and 34 at intervals of the counter 10 cycle corresponding to counts of $+n$ and $-n$, respectively. Sine gate 26 is opened by the $-n$ pulses and closed by the $+n$ pulses, so as to gate through an input signal received on line 36 to provide a rectangular wave output on line 6 having a pulse width proportional to the sine of an angle $\theta=360n/N$ degrees. Typically, a DC input on line 36 will result in a corresponding DC level on line 6 when gate 26 is open.

The manner in which the cosine signal is generated by the digital-to-analog converter of FIG. 6 differs from that of FIG. 2. In particular, each of the $+n$ pulses provided on line 24 is delayed in a delay device 86 by a period of time equal to the time taken by counter 10 to count through 3N/4 counts. Thus, delay counter 86 provides output pulses along a line 88 each occurring at a phase in the counter cycle designated by $+n+3N/4$. These pulses are represented by vector V3' in FIG. 5, and are seen to lag by 270° the $+n$ pulses represented by vector V1.

Similarly, a second delay device 90 receives the $-n$ pulses along line 34, and delays each such pulse for a period of time equal to the time taken by counter 10 to count through N/4 counts. That is, each of the $-n$ pulses is delayed for the equivalent of 90° of the counter 10 cycle. Delay 90 provides output pulses on a line 92 occurring at a phase in the counter cycle designated by $-n+N/4$. These pulses are represented by vector V4' in FIG. 5, and are seen to lag by 90° the $-n$ pulses represented by vector V2.

If counter 10 is adapted to advance repetitively through 2,000 counts, for example, delay device 86 and 90 each may comprise a counter advancing at the same rate as counter 10, and providing outputs lagging pulses $+n$ and $-n$ respectively by 1,500 and 500 counts.

A gate 46' (corresponding to gate 46 of FIG. 3) is opened by the $+n+3N/4$pulses along line 88 (see FIG. 6), and is closed by the $-n+N/4$ pulses along line 92. Gate 46' thus gates through an input received along line 36 to provide on line 8 a rectangular wave signal having a pulse width proportional to the cosine of the angle $\theta=360n/N°$. Both the sine signal on line 6 and the cosine signal on line 8 are symmetrically spaced about the zero reference point or phase of counter 10, as illustrated in FIG. 5.

Figure 7:
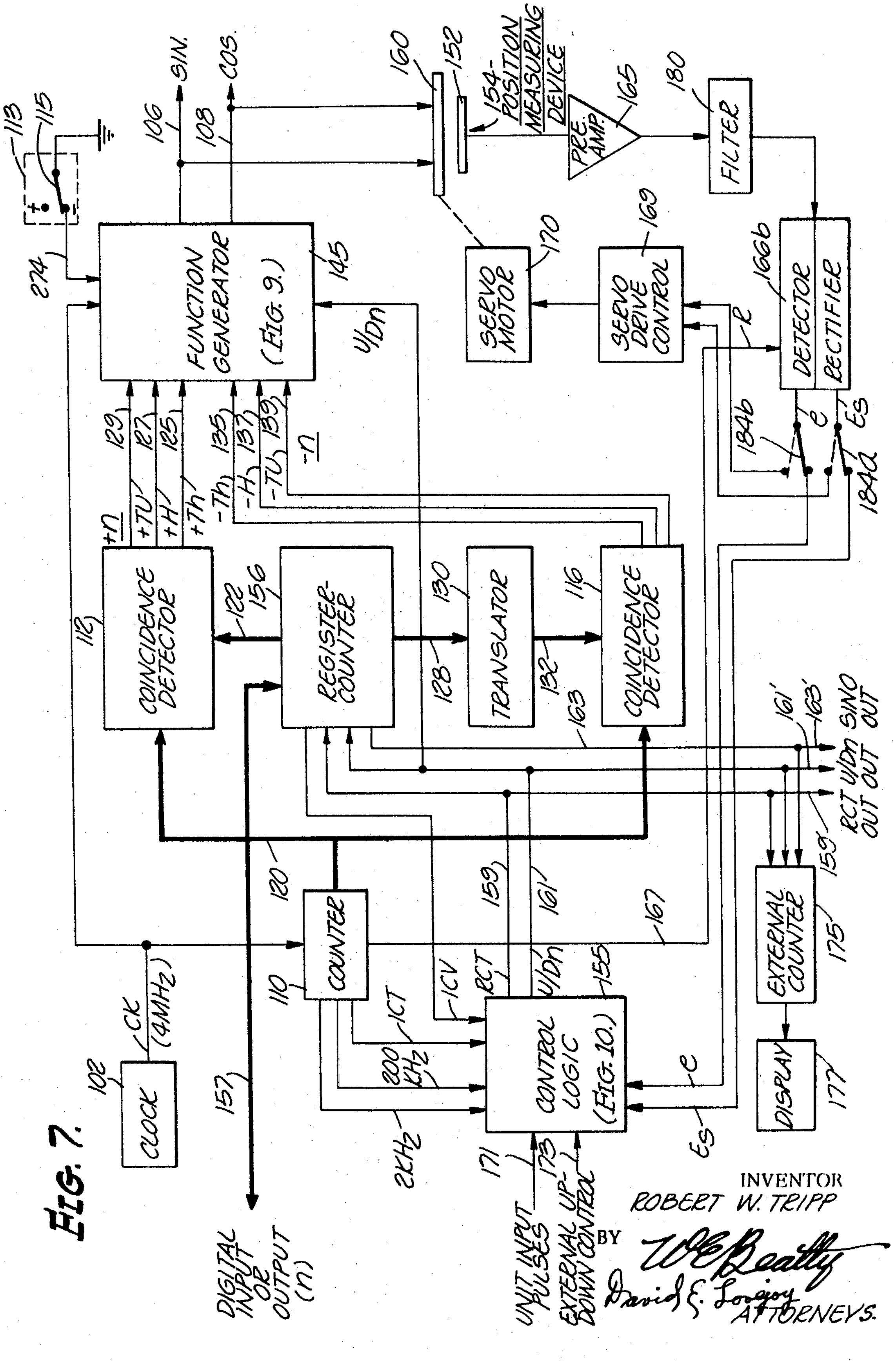
FIG. 7 is a block diagram of another embodiment of a digital and analog converter in accordance with the present invention.
Figure 9:
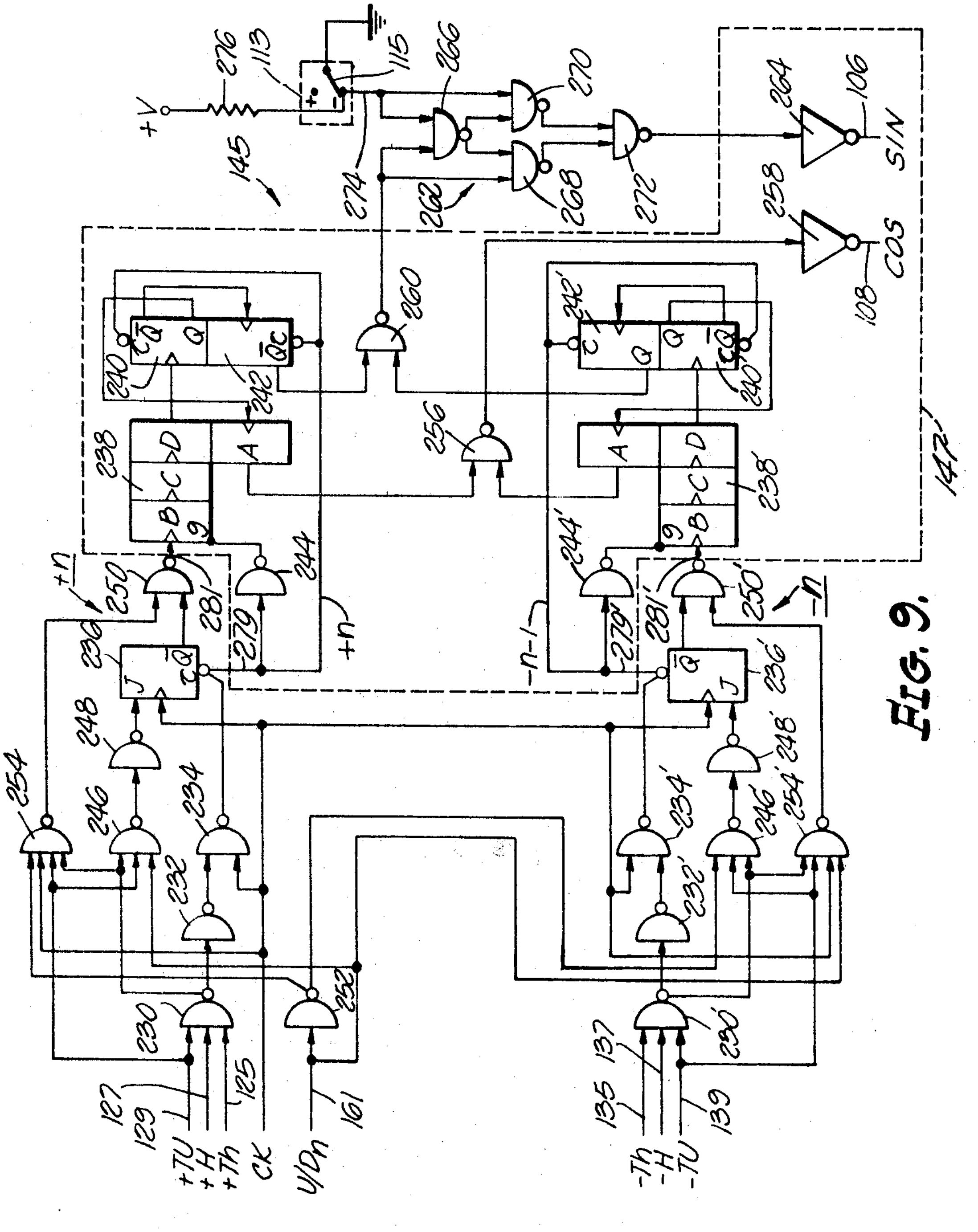
FIG. 9 is an electrical schematic diagram of a trigonometric function generator in accordance with another aspect of the present invention; this function generator is utilized in the converter of FIG. 7.

FIG. 7 is a block diagram of a position control and indicating system, which in accordance with one aspect of the present invention, functions as an analog and digital converter. The system of FIG. 7 uses a function generator as shown in FIG. 9. Referring to FIG. 7, a clock 102 provides a train of clock pulses CK to a counter 110. Typically, counter 110 may comprise a conventional binary-coded decimal (BCD) counter having units, tens, hundreds, and thousands decades.

To correspond with the illustrative vector diagram of FIG. 5, counter 110 will be described herein as being adapted to count repetitively through N=2,000 counts. That is, counter 110 counts from 0 through 1,999, and then resets to 0 each 2,000th pulse from clock 102. In such an illustrative embodiment, the clock pulses CK may have a frequency of NF=4MHz, so that counter 110 completes a cycle of N=2,000 counts at a rate or frequency F=2kHz. Of course, these values of N and of the clock frequency are illustrative only and are not limiting of the actual values which may be employed in the inventive system.

The reference count or contents of counter 110 is available on an output channel 120 corresponding to channel 20 of FIGS. 2 or 6. In the illustrative embodiment, channel 120 may contain 16 pairs of wires, four pairs for each of the four BCD digits.

Register-counter 156 comprises a reversible (up-down) counter which in the present system performs the function of register 4 of FIG. 6. Typically, register-counter 156 comprises a binary-coded decimal counter having sufficient digit positions to store a number $n$ ranging from 0 to N. In one mode of operation, an externally supplied digital input, comprising a number $n$ in BCD form, may be loaded into register-counter 156 via an input/output channel 157. For input data in parallel form, channel 157 may be of the same nature as channel 120. Alternatively, the input BCD data may be supplied serially along a single line, appropriate conventional circuitry being provided to load the data bits into the respective units, tens, hundreds and thousands decades of register-counter 156.

Coincidence detector 112 corresponds to coincidence detector 12 of FIG. 6, and functions to compare digit-by-digit the contents of counter 110 (received along a channel 120) with the contents of register-counter 156 (received along channel 122). When coincidence between the thousands digit of counter 110 and the thousands digit of register-counter 156 occurs, an output pulse, herein designated +Th, is produced by coincidence detector 112 on line 125. Similarly, when coincidence detector 123 determines that the contents of the hundreds decade of counter 110 is identical to the contents of the hundreds decade of register-counter 156, an output pulse, herein designated +H, is produced on line 127. When simultaneous coincidence in both the units digit and tens digit of the contents of counter 110 and register-counter 156 is detected, an output pulse, herein designated +TU, is produced on line 129. Note that when the contents of counter 110 is identical in all digits to the contents of register-counter 156, +Th, +H and +TU pulses will occur simultaneously; this simultaneous occurrence corresponding to the generation of a $+n$ pulse by coincidence detector 12 in the apparatus of FIG. 6.

A translator 130 corresponds to translator 30 of FIG. 6 and receives along a channel 128 the contents of register-counter 156. Translator 130 provides, along a channel 132, an output which is a function of the complement of the contents of register-counter 156. In a preferred embodiment, translator 130 provides an output which is the 9's complement of the BCD contents of register-counter 156.

Still referring to FIG. 7, a coincidence detector 116 functions to compare digit-by-digit the contents of counter 110 with the translated contents of register-counter 156. Thus, when coincidence is detected between the contents of the thousands digit of counter 110 and the thousands digit output of translator 130, and output pulse, herein designated −Th, is provided on a line 135. When coincidence is detected in the hundreds digit, an output pulse, herein designated −H, is provided on a line 137. Similarly, when simultaneous coincidence in all digits is detected between the contents of counter 110 and the translator 130, an output pulse, herein designated −TU, is provided on line 39. When simultaneous coincidence in all digits is detected between the contents of counter 110 and the translated contents of register-counter 156, the −Th, −H, and −TU pulses occur simultaneously; this situation is analogous to generation of a $-n-1$ pulse by coincidence detector 16 in the apparatus of FIG. 6.

The output pulses from coincidence detectors 112 and 116 (see FIG. 7) are supplied to a function generator 145, details of which are set forth hereinbelow in conjunction with FIG. 9. Function generator 145 also is described in conjunction with FIG. 12 below. In particular, function generator 145 accepts the +Th, +H, +TU, −Th, −H and −TU pulses, and produces therefrom rectangular wave signals, along lines 106 and 108, having pulse widths corresponding respectively to the sine and cosine of the angle $\theta=360n/N$ degrees.

Thus, the system of FIG. 7 may be used as a digital-to-analog converter to convert an input digital number $n$, supplied on channel 157, to analog signals (on lines 106 and 108) of fixed phase, of fundamental frequency F, and having pulse widths proportional to the sine and cosine of an angle $\theta=2\pi n/N$.

In a system analogous to that of FIG. 4, the trigonometrically related signals along line 106 and 108 (see FIG. 7) may function as inputs to a position-measuring device or resolver 154. As mentioned above in conjunction with resolver 54 of FIG. 4, device 154 advantageously may comprise a linear or rotary position-measuring transformer, marked under the registered trademark "Inductosyn" and described, for example, in U.S. Pat. No. 2,799,835.

Position-measuring device 154 includes an input member 160, advantageously movable, having two windings in space quadrature of the pole cycle of the device; these windings are energized with the trigonometrically related signals from function generator 145. Position-measuring device 154 also has a stationary member 152 which may include a continuous conductor forming a multipolar secondary winding for the device 154.

In a typical application, movable member 160 of device 154 is attached to the relatively movable member of a machine (not shown) to be controlled by the inventive system. Likewise, the stationary output member 152 of position-measuring device 154 is attached to the relatively fixed member of the machine.

The movable and fixed members 160 and 152 of position-measuring device 154 may be either linear or rotary in form depending on the particular system application. For some applications, involving position-measuring or control, one form is preferred to the other form.

As is well known, in such a position-measuring device 154, the position of movable member 160, with respect to fixed member 152, is indicated by the relative displacement of the secondary winding with respect to the primary windings. The displacement is represented as an angle measured in electrical degrees. Thus, the spacing of three consecutive conductors of the secondary winding corresponds to a cycle of 360 electrical degrees which is equivalent, for example, to 0.2 linear inches. For the example given, device 154 would pass through a cycle every 0.2 inches, hence one count of register-counter 156 is equivalent to 0.0001 inches of movement. Similarly, for a rotary device passing through a cycle of 360 electrical degrees for one complete rotation, one count of register-counter 156 is equivalent to rotation through 0.18°.

Referring once again to FIG. 7, the error signal induced in member 152 of position-measuring measuring device 154 is amplified by a conventional preamplifier 165 and routed through a filter 180 which passes fundamental frequency F but rejects all harmonics of F. The error signal received from the preamplifier is changed by filter 180 into a sinusoidal signal having a magnitude which is a function of the difference between the command position represented by sine and cosine signals from function generator 145 and the actual position of the movable member 160 in a cycle of the measuring device 154.

The output signal from filter 180 is processed through a conventional full wave rectifier and associated circuitry **166*a* to produce a signal Es the state or sign of which indicates whether the magnitude of the error signal from device 154 is above or below a predetermined value. The output signal from filter 180 also is processed through a conventional phase detector 166*b*** which generates a DC error signal, *e*. The state or sign of error signal *e* indicates the direction of positional error of device 154. Phase detector **166*b* receives a reference phase output, designated R in FIG. 11, on a line 167 from counter 110**.

The relationship of the sign of the error signal *e* and the direction of positional error of measuring device 154 is controlled by a sine reversing switch 113 which has a + a − position for reversing the polarity of the sine signal into position measuring device 154. By reversing the switch position, a positive number may be represented by either left or right machine motion relative to a reference on the machine. The minus (−) input for reversing the polarity of the signal is connected to function generator 145 when switch 113 is closed. Arm 115 of the switch is shown connected to electrical ground for providing the relatively low, or minus, input when switch 113 is in the (−) position.

A pair of ganged switches **184*a* and 184*b* (see FIG. 7**) are provided which, when in the full line position shown, connect the respective signals is and *e* to control logic 155. A detailed description of control logic 155 is set forth hereinbelow in conjunction with FIG. 10. Among the functions of control logic 155 is the generation of pulses, herein designated RCT (for "reversible counter toggle") along a line 159 in response to presence of the error signal *e*. The sign of error signal *e* causes logic 155 to control a U/Dn signal along a line 161; the U/Dn signal controls whether the RCT pulses increment or decrement register-counter 156. The pulse rate of the RCT pulses is controlled by control logic 155 in response to the sign of the error signal Es.

To insure that false counts do not occur in register-counter 156, the RCT pulses are synchronized in control logic 155 with the units count pulse ICT from counter 110 and with the units count pulse 1CV of register-counter 156. Circuitry to accomplish this synchronization also is described in conjunction with FIG. 10.

Thus, when switches **184*a* and 184*b* are in the full line position shown, if the position of movable member 160 of position-measuring device 154 does not correspond to the position indicated by the digital number $n$ stored in register-counter 156 (and hence by the sin $\theta$ and cos $\theta$ signals on lines 106 and 108**) an error signal *e* will be produced. The RCT pulses produced in response to this error signal will appropriately change the contents of register-counter 156 (and hence the values of sin $\theta$ and cos $\theta$) in a direction tending to reduce the magnitude of the error signal to a small value. RCT pulses will continue to be generated by control logic 155 until the new number $n$ developed in register-counter 156 corresponds to the actual position of movable member 160. This number $n$ developed in register-counter 156 itself may be provided as a system output, in either parallel or serial form, via channel 157.

The RCT pulses on line 159 and the U/Dn signal on line 161 may be utilized to operate an external counter 175 having greater counting capacity than register-counter 156, and an external display unit 177 slaved to counter 175. Such counter 175 and display 177 are useful in conjunction with a position-measuring device 154 of the type having a plurality of cyclically recurring zero positions. With such a device 154, the contents of register-counter 156 represent the position of movable member 160 within one of the position-measuring device cycles. External counter 175, advanced by RCT pulses in an up or down direction determined by the state of the U/Dn signal, can maintain a count of the actual position of the machine with which measuring device 154 is used, even when device 154 has passed through more than one cycle.

Also, the RCT pulses on line 159 and the U/Dn signal on line 161 are provided as system outputs at terminals 159′ ("RCT out") and 161′ ("U/Dn out") respectively in FIG. 7. Thus the RCT and U/Dn signals may be used externally to operate a counter and display analogous to counter 175 and display 177, or may be used, e.g., as computer inputs. An additional output along a line 163 from the register-counter 156, herein designated "sin 0 out," indicates when all digits of register-counter 156 are zero, thereby indicating passage of position-measuring device 154 through one of its cyclic zero positions.

Each RCT pulse corresponds to unit motion, however assumed or imposed, by member 160 of position-measuring device 154. Thus in the illustrative example wherein N=2,000 and wherein a cycle of device 154 corresponds to 0.2 linear inches or 360° of rotation, each RCT pulse indicates that member 160 has moved 0.0001 linear inches or 0.18° of rotation.

In an alternative mode of system operation, when switches 184$a$ and 184$b$ are placed in the position shown in phantom in FIG. 7, the error signals $e$ and Es are used to operate a servomotor 170 via a conventional servo drive control 169. Servomotor 170 itself is connected to drive the movable machine member (not shown) to which member 160 of position-measuring device 154 is attached. In this manner, the existence of an error signal $e$ will cause servomotor 170 to move member 160 in a direction, controlled by the sign of error signal $e$, tending to reduce the error signal from position-measuring device 154 to a small value. The rate of servomotor 170 may be controlled by the sign of error signal Es indicative of the amplitude of the error signal from position-measuring device 154. When the error signal from device 154 is reduced to minimum value, the position of member 160 will be indicative of the digital contents $n$ of register-counter 156.

Thus, if it is desired to move member 160 to a command position, a digital number $n$ indicative of the command position may be supplied to register-counter 156 along channel 157. In response thereto, corresponding trigonometrically related signals will be developed on lines 106 and 108. If the position of movable member 160 of device 154 does not occur with the angle $\theta$ indicated by these trigonometric signals, the error signals $e$ and Es will cause servomotor 170 to drive device 154 to the desired position.

In a related mode of operation, with switches 184$a$ and 184$b$ still in the phantom position, register-counter 156 may be incremented or decremented in response to unit input pulses supplied along a line 171 from an external source. These unit input pulses (see FIG. 7) enter control logic 155, where, as will be discussed below, they cause generation of a corresponding number of RCT pulses along line 159. Similarly, an external up-down control signal supplied along a line 173 indicates whether register-counter 156 is to be incremented or decremented by the unit input pulses. The external up-down control signal is used by control logic 155 to set correspondingly the state of the U/Dn signal on line 161.

Thus, for each unit input pulse supplied on line 171, the contents of register-counter 156 changes by one count and motor 170 drives member 160 a corresponding unit of distance. In the illustrative example wherein N=2,000 and wherein each cycle of position-measuring device 154 is 0.2 linear inches or 360° of rotation, each input pulse will cause motor 170 to advance movable member 160 by 0.0001 linear inches or 0.18° of rotation.

Figure 8:
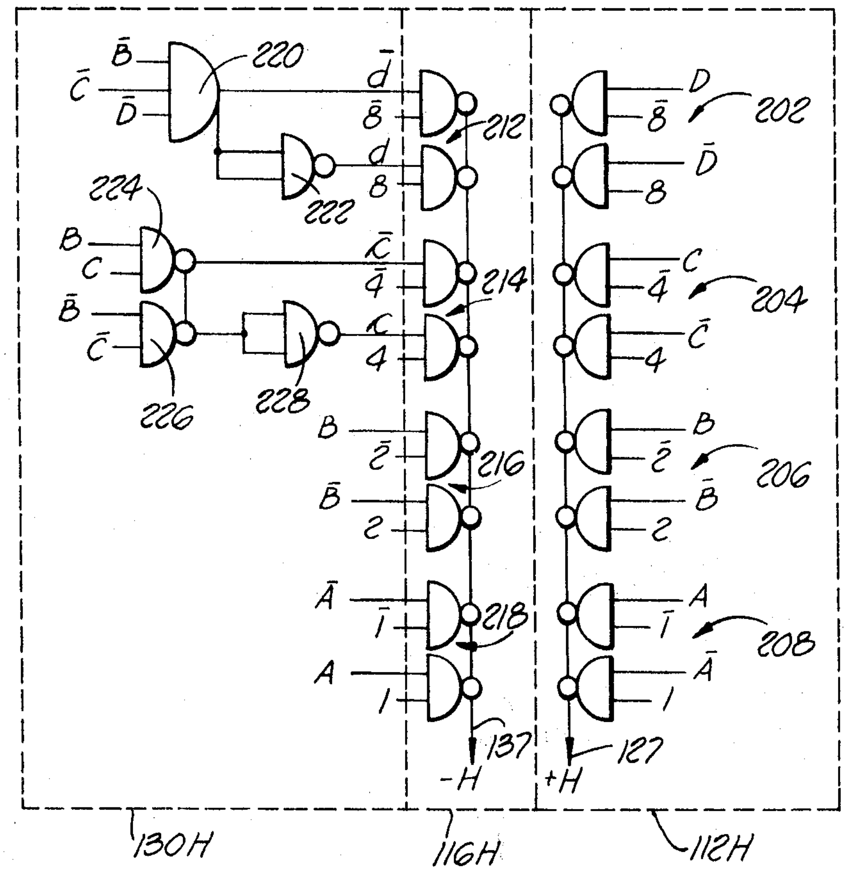
FIG. 8 is an electrical schematic diagram of a typical embodiment of the coincidence detector and translator components utilized in the converter of FIG. 7.

FIG. 8 illustrates a typical embodiment of the hundreds decade 112H of the coincidence detector 112, hundreds decade 130H of the translator 130, and hundreds decade 116H of the coincidence detector 116 components of the system of FIG. 7. Circuitry for only the hundreds decade is shown in FIG. 8, it being understood that similar circuitry is required for each decade, (e.g., units, tens) of components 112, 116 and 130.

In FIG. 8, BCD outputs from the hundreds decade of register-counter 156 are designated A, B, C, D, and $\bar{A}$, $\bar{B}$, $\bar{C}$, $\bar{D}$, and are included in channel 122 of FIG. 7, whereas outputs from the corresponding hundreds decade of counter 110 are designated by the numerals 1, 2, 4, 8 and $\bar{1}$, $\bar{2}$, $\bar{4}$, $\bar{8}$, and are included in channel 120 of FIG. 7.

NAND gate combinations 202, 204, 206 and 208 implement exclusive NOR logic for comparing, in the hundreds decade, the contents of counter 110 with the contents of register-counter 156. When there is complete coincidence between all input lines from the hundreds decades of both counters, a logic "1" level appears at the +H output on line 127. Thus, gates 202 through 208 make up the hundreds decade 112H of coincidence detector 112.

NAND gate combinations 212, 214, 126 and 218 implement exclusive NOR logic for comparing the nine's complement of the contents of register-counter 156 via channel 132 with the contents of counter 110 via channel 120. The nine's complement is obtained by logically treating certain outputs from register-counter 156 in translator 130 as described below. Thus, gates 212 through 218 make up the hundreds decade 116H of coincidence detector 116.

AND-gate 220 in combination with NAND-gate 222 complements the most significant bit D from register-counter 156. NAND-gates 224 and 226 in combination with NAND-gate 228 complement the next significant bit C from register-counter 156. The B bit does not change in its complemented state and the A bit is complemented by reversing the inputs to the NAND gate combination 218. Therefore, instead of comparing A with $\bar{1}$ as in gate combination 208, $\bar{A}$ is compared with $\bar{1}$ in NAND gate combination 218. Thus, gates 220 through 228 make up the hundreds decade 130H of translator 130.

When there is coincidence, in the hundreds decade, between the contents of counter 110 and the nine's complement of the contents of register-counter 156, a logic "1" appears at the −H output on line 137. Both the +H and −H outputs are connected to function generator 145.

Referring now to FIG. 9, there is shown a schematic diagram of a preferred embodiment of function generator 145. Function generator 145 includes a $+n$ channel receiving the +Th, +H and +TU H signals from coincidence detector 116 (see FIG. 7). Much of the circuitry in the $+n$ and $-n$ channels is identical, hence only the $+n$ channel is described in detail. Primes of the numerical designations used in describing the $+n$ channels are used to designate identical circuitry in the $-n$ channel. The components within block 147 (dashed lines) also are shown in conjunction with FIG. 12.

The device designated 230 and each of the numerous devices of identical appearance in FIG. 9 is a NAND gate which produces a false or logic 0 output level when, and only when, all of its inputs are true or logic 1. Such a NAND gate provides a logic 1 output when any or all of its inputs are false or logic 0. Logic 1 may be realized by a positive voltage, and logic 0 by ground or zero potential.

NAND-gates 230 receives three inputs, the +Th, +H and +TU signals on lines 125, 127 and 129, respectively. The output of NAND-gate 230 is false (logic 0) only when all three of the +Th, +H and +TU signals are true, i.e., upon detection of coincidence in all digits between the contents of counter 110 and the contents of register-counter 156. Thus, the output pulses from NAND-gate 230 are analogous to the $+n$ pulses on line 24 of FIG. 6.

The $+n$ pulses provided by NAND-gate 230 are inverted by a NAND-gate 232 and synchronized with clock pulses CK (from clock 102 of FIG. 7) in a NAND-gate 234. The $+n$ pulses are used to preset a delay flip-flop 236, a biquinary counter 238, and a pair of flip-flops 240 and 242. In accordance with conventional logic circuitry practice, the various flip-flops of function generator 145 are set by negative going signals. Thus, when the output of NAND-gate 234 goes from true to false, upon occurrence of a clock synchronized $+n$ pulse, each of flip-flops 236, 240 and 242 is preset to the $\overline{Q}$ state.

The output of NAND-gate 234 is inverted by a NAND-gate 244 to provide a positive clock synchronized $+n$ pulse, the trailing edge of which is used to preset biquinary counter 238 to a count of 9. Specifically, the "quinary" stages B, C and D of counter 238, which stages provide one output pulse for each five count pulses received, are preset to a count of 4. Binary stage A for counter 238, which stage provides one output pulse for each two input pulses received, is preset to the logic 1 state by the output of NAND-gate 244.

Still referring to FIG. 9, function generator 145 also receives the U/Dn signal on line 161. The state of the U/Dn signal, indicating whether register-counter 156 (see FIG. 7) is counting up or down, is used to control whether a one count delay, mechanized by flip-flop 236 or 236′, is inserted in the $+n$ or $-n$ channel. This inserted delay insures correct operation of function generator 145 regardless of the counting direction of register-counter 156, and further is useful, as described below, in preventing jitter in external display 177 used to indicate the contents of register-counter 156. In the system illustrated, the U/Dn signal is true when register-counter 156 is counting up, and false when register-counter 156 is counting down, or is being neither incremented nor decremented.

When the U/Dn signal is false, indicating that register-counter 156 is not counting or is being decremented, a one count delay implemented by flip-flop 234′ is inserted in the $-n$ channel; no similar delay is inserted in the $+n$ channel. Such a configuration corresponds to FIG. 6, with flip-flop 234′ functioning as a delay 17 in the $-n$ channel.

The U/Dn signal on line 161 provides one input to a NAND-gate 246, the output of which is inverted by a NAND-gate 248. Thus, when the U/Dn signal is false, the output of NAND-gate 246 remains true and the output of NAND-gate 248 remains false. In this situation, flip-flop 236 remains in its preset state with the $\overline{Q}$ output providing a true input signal to a NAND-gate 250. Further, the false U/Dn signal is inverted by a NAND-gate 252 to provide a true signal as one input to a NAND-gate 254. NAND-gate 254 also receives as inputs the clock pulses CK, the +TU signal on line 129, and the output of NAND-gate 230.

Recall that the output of NAND-gate 230 is false upon occurrence of the $+n$ condition, i.e., when coincidence in all digits is detected between the contents of counter 110 and the contents of register-counter 156. Thus, the four inputs to NAND-gate 254 are all true (assuming U/Dn false), and hence the output of NAND-gate 254 is false, each time a +TU signal is present on line 129, except upon simultaneous occurrence of a $+n$ pulse. The output of NAND-gate 254 is inverted by NAND-gate 250, the output of NAND-gate 250 comprising a train of positive pulses occurring each 100 counts of counter 110, starting exactly 100 counts after the $+n$ full coincidence condition.

As just described, occurrence of the first +TU pulse after the $+n$ full coincidence condition pulse will cause NAND-gate 250 to provide a first count pulse to biquinary counter 238. Since stages B, C and D of counter 238 were preset to a count of 4 by occurrence of the $+n$ pulse, this first count pulse causes these quinary stages to reach a count of 5. That is, quinary stages 238B, C and D reset to zero and provide an output signal which toggles flip-flop 240 from the $\overline{Q}$ state (to which it had been preset) to the Q state. When thus toggled, the $\overline{Q}$ output of flip-flop 240 goes from true to false, thereby toggling flip-flop 242 from the $\overline{Q}$ (to which it had been preset) to the Q condition.

For each successive 100 counts of counter 110, another pulse occurs at the output NAND-gate 250 to advance counter 238. After five such count pulses, i.e., exactly 600 counts (of counter 110) after the $+n$ coincidence condition, counter 238 supplies another output pulse to drive flip-flop 240 from the Q to $\overline{Q}$ state. The resultant true to false transition of the Q output of flip-flop 240 causes binary stage A of counter 238 to toggle from the logic 1 state (to which it had been preset) to logical 0 state. The $\overline{Q}$ output of flip-flop 240 goes from false to true, and hence does not toggle flip-flop 242.

After an additional 500 counts of counter 110, five more pulses have been received by biquinary counter 238, producing another output pulse from counter stage 238D. This pulse, occurring at the time $+n+1{,}100$ causes flip-flop 240 to go from the $\overline{Q}$ to the Q state. As a result, the $\overline{Q}$ output from flip-flop 240 goes from true to false, causing flip-flop 242 to toggle from the Q to $\overline{Q}$ state. Thus, it is evident that the $\overline{Q}$ output of flip-flop 242 changes state each 1,000 counts of counter 110, starting with a transition from true to false at time $+n+100$.

The next output pulse from counter stage 238D occurs at a count of $+n+1{,}600=+n-400$ and causes flip-flop 240 to switch from the Q to the $\overline{Q}$ state. This transition in turn toggles binary stage A of counter 238 from logic 0 to logic 1. Thus the output of counter stage 238A alternates between true and false each 1,000 counts of counter 110, starting with a true to false transition at a count of $+n+600$.

Figure 11:
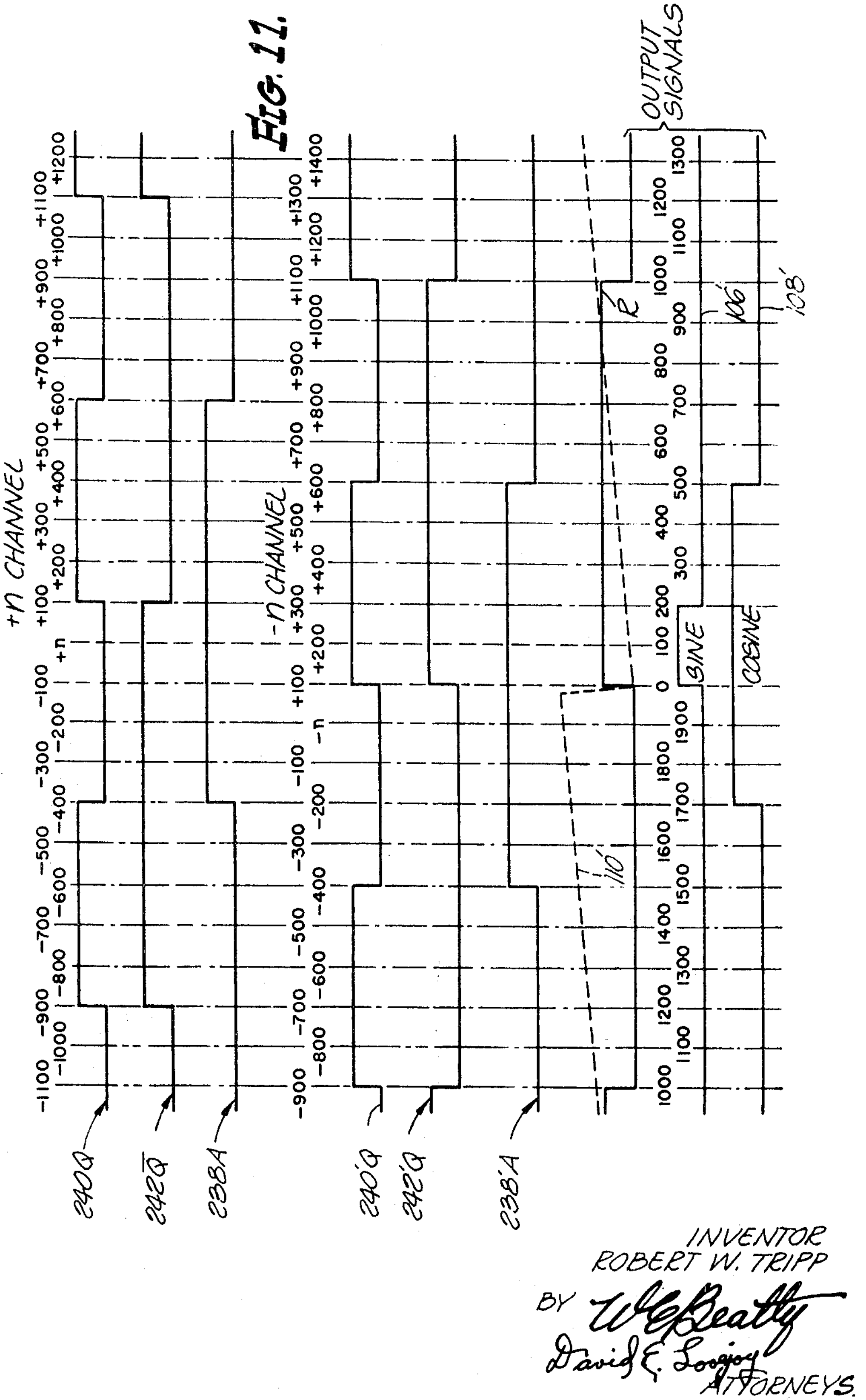
FIG. 11 is a set of waveforms useful in explaining operation of the function generator shown in FIG. 9.

Operation of the $+n$ channel of function generator 145 may be summarized in conjunction with the waveforms of FIG. 11. Referring to FIG. 11, curve 110′ indicates the contents of counter 110; although shown as a sloping line, the digital contents of counter 110 actually change in stairstep fashion. The numbers directly beneath waveform 110′ represent the numerical contents of counter 110, digitally varying through N=2,000 counts from 0 to 1,999, then resetting to 0.

In the example of FIG. 11, register-counter 156 is storing a digital number $n=100$, so that function generator 145 produces the "SINE" and "COSINE" rectangular wave signals illustrated in FIG. 11. The pulse widths of these signals are indicative of the corresponding sine and cosine of an angle $\theta=3600n/N^{\circ}=(360)(100/2{,}000)^{\circ}=18^{\circ}$.

The waveform designated 240Q in FIG. 11 indicates the state of the Q output from flip-flop 240 (see FIG. 9); similarly the waveform 242$\overline{Q}$ indicates the state of the $\overline{Q}$ output from flip-flop 242. The waveform designated 238A represents the state of stage A of counter 238. The numbers immediately above curve 240Q represent counts of counter 110 leading and lagging the occurrence time of the $+n$ pulse.

As discussed hereinabove in conjunction with FIG. 9, notice that the Q output of flip-flop 242 alternates between logic 1 and logic 0 each 1,000 counts of counter 110, beginning with a true to false transition at time $+n=100$. Similarly, the output of stage A of counter 238 alternates between logic 1 and logic 0 each 1,000 counts of reference counter 110, beginning with a true to false transition at $+n+600$.

Operation of the $-n$ channel of function generator 145 (see FIG. 9) is similar to that of the $+n$ channel, except that flip-flop 236′ is used to introduce a one count delay analogous to that of delay 17 in FIG. 6. This one count delay compensates for the fact that translator 130 provides the nine's complement, rather than the 10's complement, of the contents of register-counter 156. That is, simultaneous occurrence of the −TU, −H and −Th signals corresponds to a count in counter 110 of N−n−1 (or simply, −n−1), rather than −n.

In the −n channel, the U/Dn signal on line 161 is fed directly to NAND-gate 254′. Thus, when U/Dn is false, gate 254′ does not pass the −TU signals but rather provides a constant logic 1 output to NAND-gate 250′. At the same time, the false U/Dn signal is inverted by NAND-gate 252 to provide a true input to NAND-gate 246′. NAND-gate 246′ also receives as inputs the −TU signal on line 139 and the inverted output of NAND-gate 230′.

Analogous to NAND-gate 230 in the +n channel, the output of NAND-gate 230′ is true at all times except when the −Th, −H and −TU signals all occur simultaneously. This simultaneous occurrence indicates that the contents of counter 110 equals in all decades the nine's complement N−n−1 (or simply, −n−1) of the contents of register-counter 156. The output of NAND-gate 246′ is inverted by NAND-gate 248′ to provide a train of positive pulses occurring in coincidence with the −TU pulses on line 139, and starting exactly 100 counts after occurrence of the −n−1 condition.

Flip-flop 236′ is reset to the Q̄ state by a clock synchronized −n−1 pulse from NAND-gate 234′. Thus, on occurrence on the first −TU pulse following by 100 counts the −n−1 full coincidence condition, flip-flop 236′ toggles to the Q state. One clock pulse CK later, corresponding to one count of counter 110, flip-flop 236′ is triggered by CK back to the Q̄ state, causing the Q̄ output line to go from false to true. This output effectively is inverted by NAND-gate 250′ to provide as an input to biquinary counter 238′ a first count pulse delayed by 101 counts from the −n−1 full coincidence count. That is, the first count pulse entering counter 238′ occurs at a count of −n+100, exactly analogous to occurrence of the first count pulse to counter 238 at count +n++100. Subsequent count pulses to counter 238′ occur each 100 counts of counter 110.

Operation of the remainder of the −n channel circuitry is identical to that of the +n channel, with the exception that a Q, rather than a Q̄, output is taken from flip-flop 242′.

Referring again to FIG. 11, waveforms 240′Q and 242′Q represent the Q outputs of flip-flops 240′ and 242′, respectively. Similarly, the curve marked 238′A represents the state of stage A of biquinary counter 238′. The numbers immediately above waveform 240′Q represent counts of counter 110 leading and lagging occurrence of the −n pulse. Note that the Q output of flip-flop 242′ alternates between logic 1 and logic 0 each 1,000 counts of counter 110, beginning with a false to true transition at time −n+100. Similarly, the output of stage A of counter 238′ alternates between logic 1 and logic 0 each 1,000 counts of counter 110, beginning with a true to false transition at a time −n+600.

For generation of the cosine signal, a NAND-gate 256 and an inverting amplifier 258 are used as shown in FIG. 9. NAND-gate 256 receives one input from stage A biquinary counter 238 and another input from stage A of biquinary counter 238′. As noted in conjunction with FIG. 11, the output of counter stage 238A is true from count +n−400=+n+1,600 to count +n+600. Similarly, the output of counter stage 238′A is true from count −n−400=n+1,600 to count −n+600. Since the output of NAND-gates 256 is false only when both of its inputs are true, NAND-gate 256 provides a signal which is false from count +n+1,600 to count +n+600. This signal is inverted by amplifier 258 to produce on line 108 the cosine signal 108′ designated COSINE in FIG. 11.

For generation of sine signal, a NAND-gate 260 receives as a first input the Q̄ output of flip-flop 242, and as a second input the Q output of flip-flop 242′. As noted in conjunction with FIG. 11, the Q̄ output of flip-flop 242 is true from count +n−900=+n+1,100 to count +n+100. Similarly, the Q output of flip-flop 242′ is true from count −n+100 to count −n+1,100. Thus, both inputs of NAND-gate 260 are true from count −n+100 to count +n+100, and the output of NAND-gate 260 is false during this time. With sine switch 113 set at the −terminal, as shown in FIG. 9, the output of NAND-gate 260 is unchanged by the logic circuitry indicated generally at 262, but is inverted by an amplifier 264. The output from inverting amplifier 264 is a signal on line 106 which is true between count −n+100 and count + n+100, as illustrated by the waveform 106′ designated SINE in FIG. 11.

Sine inverting logic 262 (see FIG. 9) itself comprises NAND-gates 266, 268, 270 and 272, the output of NAND-gate 272 providing the input to inverting amplifier 264. When switch 113 is set at the −terminal as illustrated, line 274 is at ground potential (logic 0), so that the outputs from NAND-gates 266 and 270 both are true. In this situation the output from NAND-gate 260 is inverted a first time by NAND-gate 268 and a second time by NAND-gate 272, so that the signal fed to inverting amplifier 264 is identical to that available at the output of NAND-gate 260.

When switch 113 is set to the +terminal, a voltage +V is available via a resistor 276 to line 274; this corresponds to setting line 274 to a logic 1 state. As a result, when the output of NAND-gate 260 is true, the output of NAND-gate 266 is false, the outputs of NAND-gates 268 and 270 both are true, and a false output is derived from NAND-gate 272. Alternatively, when the output of NAND-gate 260 is false, the output of NAND-gate 266 is true, the output of NAND-gate 268 is true, the output of NAND-gate 270 is false, causing a true output to be derived from NAND-gate 272. In this fashion the output of NAND-gate 260 is inverted a first time by logic 262 prior to being inverted a second time by amplifier 264, thereby producing a SINE signal on line 106 having a polarity opposite that indicated in FIG. 11.

From the foregoing discussion it should be apparent that NAND-gate 260 and inverting amplifier 264 function analogously to gate 26 in the function generator of FIG. 6. Similarly, NAND-gate 256 and inverting amplifier 258 function analogously to gate 46′ in the embodiment of FIG. 6. Note, however, that the sine signal from function generator 145 (see FIG. 9) is gated on at −n+100 and gated off at +n+100, rather than at −n and +n respectively, as illustrated in FIG. 5. Thus, the sine and cosine signals generated by function generator 145 are symmetrically spaced about the 100 count of counter 110, rather than about the zero count as indicated in FIG. 5. Alternatively expressed, a vector diagram describing the operation of function generator 145 would be identical to that of FIG. 5, with all vectors shifted clockwise by a count of 100.

Figure 10:
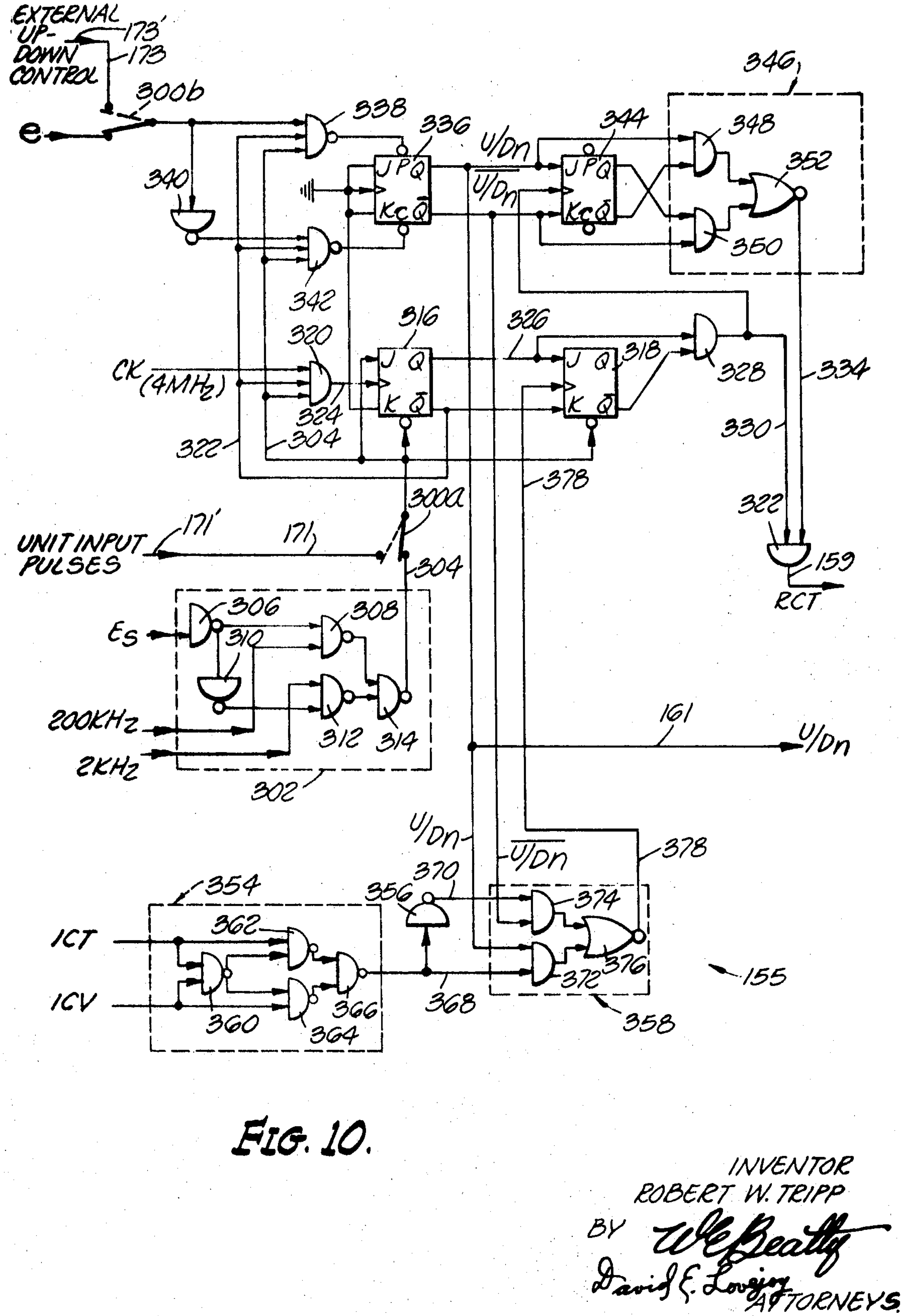
FIG. 10 is an electrical schematic diagram of typical control logic useful in conjunction with the converter of FIG. 7.

Referring now to FIG. 10, there is shown a typical embodiment of control logic 155 included in the digital and analog converter of FIG. 7. In general, logic 155 controls the production of RCT pulses and sets the state of the U/Dn signal. Thus, when switches 184a and 184b (see FIG. 7) and a pair of switches 300a and 300b (see FIG. 10) all are in the full line positions shown, logic 155 sets the state of the U/Dn signal in response to the sign of the error signal e. At the same time, the RCT pulse rate is controlled in response to the state of the Es signal. Control logic 155 also insures that the RCT pulses are synchronized appropriately with the unit advance pulses 1CT and 1CV from counter 110 and register-counter 156, respectively. Further, to facilitate elimination of jitter in an external display, control logic 155 inhibits RCT generation upon sensing a change in sign of the error signal e. Jitter elimination also is described and claimed in the cited U.S. application Ser. No. 809,533.

In an alternative mode of operation, with switches 300a and 300b (see FIG. 10) all in the phantom positions shown, one RCT pulse is generated for each unit input pulse supplied on a line 171 to control logic 155. At the same time, the state of the U/Dn signal is set by control logic 155 in response to an external up-down control signal supplied on a line 173. This mode of operation is useful for controlling the motion of a machine member to which position-measuring device 154 (see FIG. 7) is attached. Thus, with switches 184a and 184b in the phantom positions shown, servomotor 170 will drive movable member 160 of device 154 through the distance (e.g., 0.0001 linear inch or 0.18°) represented by one count of register-counter 156 for each unit input pulse supplied on line 171 to control logic 155. Similarly, the external up-down control signal on line 173 will determine the direction in which member 160 is moved.

With specific reference to FIG. 10, logic circuitry 302 controls the RCT pulse rate in response to the state of the E*s* signal. The signal E*s* is true when the magnitude of the error signal from position measuring device 154 is below a predetermined level. Thus, E*s* is true when movable member 160 of device 154 is relatively near the position designated by the contents *n* of register-counter 156, and hence designated by the sine and cosine signals from function generator 145. In this situation (E*s* true) RCT pulses are produced at a relatively slow rate generally corresponding to the cycle time of counter 110; in the example described herein, RCT pulses are produced at 2 kHz. Control of the RCT pulse rate also is described and claimed in the cited U.S. application Ser. No. 809,533.

Conversely, E*s* is false when the magnitude of the error signal from position-measuring device 154 exceeds the predetermined level. Thus, E*s* is false when movable member 160 is relatively far from the position designated by the contents of register-counter 156. In this situation (E*s* false) it is necessary to update register-counter 154 at a much faster rate. Thus, in the illustrative embodiment, when E*s* is false, RCT pulses are generated at a rate of 200 kHz.

Referring still to FIG. 10, logic circuitry 302 receives as inputs the signal E*s* from rectifier **166*a* and pulse trains at 200 kHz. and 2 kHz., these pulse trains being obtained by division of the 4 MHz clock signals CK in counter 110. Logic 302 comprises five NAND-gates designated 306, 308, 310, 312 and 314. NAND-gate 306** inverts the error signal E*s*, producing an output which is false if the magnitude of the error signal from position-measuring device 154 is below the predetermined level. In this instance, (E*s* true), the false output of NAND-gate 306 causes the output of NAND-gate 308 to remain true. Further, the output of NAND-gate 306 is inverted by NAND-gate 310 to provide a true input to NAND-gate 312 so long as E*s* remains true. As a result, positive 2 kHz. pulses provided from counter 110 are gated through to provide a corresponding logic 0 pulse train at the output of NAND-gate 312. In turn, these logic 0 pulses are inverted by NAND-gate 314 to provide along line 304 a train of positive or logic 1 pulses at the 2 kHz. rate.

Alternately, when the magnitude of the error signal from position measuring device 154 exceeds the predetermined value, E*s* is false. In this case, the output of NAND-gate 306 is a true signal, which is inverted by NAND-gate 310 to provide a false input to NAND-gate 312. As a result, the output of NAND-gate 312 remains true. At the same time, the true output from NAND-gate 306 is provided to NAND-gate 308, so that the logic 1 clock pulses at 200 kHz. from counter 110 are inverted by NAND-gate 308. The resultant train of pulses is inverted again by NAND-gate 314 to provide on line 304 a train of positive or logic 1 pulses at the 200 kHz. rate.

To summarize, with switches **184*a*, 184*b* (FIG. 7), 300*a* and 300*b* (FIG. 10) all in the full positions, logic 302 (see FIG. 10) provides on line 304 a train of pulses at a rate of 2 kHz. or 200 kHz. depending on whether the magnitude of the error signal from position-measuring device 154** is respectively below or above a predetermined value.

The pulses on line 304 preset a pair of flip-flops 316 and 318 to the $\overline{Q}$ state, and further provide a first input to an AND-gate 320. AND-gate 320 also receives as inputs the clock pulses CK from clock 102 and the $\overline{Q}$ output of flip-flop 316 on a line 322. The output of AND-gate 320 on a line 324 is applied to the trigger input of flip-flop 316.

The duration of each pulse on line 304 is approximately equal to one cycle of the clock pulse train CK, corresponding to the duration which counter 110 remains set at each count. Thus, each pulse on line 304 is true for about twice as long as a clock pulse CK. As a result, the output from AND-gate 320 comprises a train of pulses corresponding in number and time of occurrence with the pulses on line 304, but with each pulse on line 324 being approximately half the duration of the corresponding pulse on line 304.

Recall that the various flip-flops in the present system are set by logic 1 to logic 0 pulse transitions. Thus, the trailing edge of each pulse from AND-gate 320 triggers flip-flop 316 into the Q state, the corresponding pulse on line 304 providing a simultaneous input to the J terminal of flip-flop 316. Approximately one-half clock cycle later, the pulse on line 304 goes from true to false. This transition resets flip-flop 316 to $\overline{Q}$ state, since at this time the K terminal of flip-flop 316 is grounded and no toggle input is present. Flip-flop 316 remains in the $\overline{Q}$ state until the occurrence of the next 304 pulse, at which time the above described operation is repeated. Thus, the Q output of flip-flop 316, on a line 326, itself comprises a train of pulses corresponding in number and time of occurrence to the pulses on line 304.

The Q output of flip-flop 316 provides one of two inputs to an AND-gate 328, the other input being the $\overline{Q}$ output of flip-flop 318. Except as indicated below, flip-flop 318 remains in the $\overline{Q}$ state, so that the pulse train on line 326 is passed by AND-gate 328 to provide an input on a line 330 to another AND-gate 332. Normally the other input to AND-gate 332, on a line 334, is true, so that the pulses from AND-gate 328 are passed by AND-gate 332 to become the RCT pulses on line 159. In this manner control logic 155 generates RCT pulses on line 159 at a pulse rate determined by the state of the error signals E*s*. As noted, the state of the E*s* signal itself is indicative of the magnitude of the error signal from position measuring device 154.

Still referring to FIG. 10, the state of the U/Dn signal on line 161 is set by control logic 155 in response to the state of the error signal *e* from detector **166*b*. This is accomplished by means of a flip-flop 336, the J, K and toggle inputs of which are connected to ground so that flip-flop 336** can be preset to Q or to $\overline{Q}$ by an input at terminals P or C respectively. The state of error signal *e* indicates the direction of positional error of measuring device 154.

The error signal *e* provides a first input to a NAND-gate 338, and is inverted by a NAND-gate 340 to provide a first input to another NAND-gate 342. Each of NAND-gates 338 and 342 also receive as inputs the pulse train on line 304 and the $\overline{Q}$ output flip-flop 316 on line 322. The outputs of NAND-gates 338 and 342 are connected respectively to the P and C terminals of flip-flop 336.

When the error signal *e* is true, the output of NAND-gate 340 is false, which causes the output of NAND-gate 342 to remain true. However, with *e* true, occurrence of a logic 1 pulse on line 304 causes a corresponding logic 0 pulse to occur at the output of NAND-gate 338. The leading edge (i.e., the logic 1 to logic 0 transition) of this output pulse from NAND-gate 338 thus causes flip-flop 336 to go to the Q state.

Alternately, when the error signal *e* is false, the output from NAND-gate 335 remains true. The output from NAND-gate 340 provides a true input to NAND-gate 342, so that occurrence of a logic 1 pulse on line 304 causes corresponding logic 0 pulse to occur at the output of NAND-gate 342. The leading edge of this output pulse from NAND-gate 342 causes flip-flop 336 to go to the $\overline{Q}$ state.

In this manner, the state of the error signal *e* is sensed each time a pulse occurs on line 304 and is used to set flip-flop 336 accordingly. The Q output from flip-flop 336 comprises the U/Dn signal on line 161, so that U/Dn is true when *e* is true. Conversely, the Q output from flip-flop 336 herein is designated U/Dn; U/Dn is true (i.e., U/Dn is false) when *e* is false.

In conjunction with the elimination of jitter in an external display exhibiting the contents of register-counter 156, it is desirable to inhibit the first RCT pulse following a change in sign of the error signal *e*. This is accomplished in control logic 155 (see FIG. 10) by means of a flip-flop 344 and an exclusive OR-circuit 346. As described, the state or sign of error signal *e* indicates the direction of positional error of measuring device 154.

Flip-flop 344 is set to indicate the state of the error signal *e* at the time of occurrence of the last RCT pulse. Exclusive OR-circuit 346 then compares the contents of flip-flop 344 with the state of flip-flop 336 which indicates the present state of the error signal *e*. If the states of the two flip-flops are identical, a true output is obtained on line 334 from exclusive OR-circuit 346, thereby allowing an RCT pulse to pass through AND-gate 332 onto line 159. Conversely, if the state of flip-flop 344 is opposite that of flip-flop 336, indicating that the sign of the error signal *e* has changed since the last RCT pulse was generated, the output of exclusive OR-circuit 346 is false. This false signal on line 344 inhibits AND-gate 332, hence inhibiting generation of the next RCT pulse.

Setting of flip-flop 344 is accomplished by providing to the J input terminal of flip-flop 344 the U/Dn signal from the Q output of flip-flop 336. The K terminal of flip-flop 344 receives the $\overline{U/Dn}$ signal from the $\overline{Q}$ output of flip-flop 336. Flip-flop 344 is triggered by the output of AND-gate 328, that is, by the pulse which if not inhibited by AND-gate 332 will become the next RCT pulse.

Exclusive OR-circuit 346 itself comprises a pair of AND-gates 348 and 350, and a NOR-gate 352. AND-gate 348 receives the Q output of flip-flop 336 and the $\overline{Q}$ output of flip-flip 344. Thus, the output of flip-flop 348 is true only when the state of the error signal *e* has changed from false to true since generation of the last RCT pulse. Similarly, AND-gate 350 receives as inputs the Q output from flip-flop 344 and the $\overline{Q}$ output from flip-flop 336. As a result, the output of flip-flop 350 is true only when the error signal *e* has changed from true to false since occurrence of the last RCT pulse.

Thus, if no change in the state of the error signal *e* has occurred since generation of the last RCT pulse, both inputs to NOR-gate 352 will be false. Only under the condition will the output from NOR-gate 352, on line 334, be true. This true signal enables AND-gate 332 to pass the pulse on line 330, thereby providing the next RCT pulse on line 159. If the error signal *e* has changed state since the generation of the last RCT pulse, one or the other of the inputs to NOR-gate 352 will be true, and the output of NOR-gate 352 will be false. This false signal on line 334 will inhibit AND-gate 332 preventing generation of the next RCT pulse.

Thus, flip-flop 344 and exclusive OR-circuit 346 together cooperate with AND-gate 332 to inhibit generation of the RCT pulse immediately following a change in sign of the error signal *e*, indicative of a corresponding change in direction of the positional error from measuring device 154.

For proper operation of the system of FIG. 7, it is necessary that the RCT pulses be generated simultaneously with coincidence between the units count pulses 1CT and 1CV of counter 110 and register counter 156, respectively, when register-counter 156 is being incremented. Likewise, it is necessary to generate the RCT pulses at anticoincidences between 1CT and 1CV when register-counter 156 is being decremented. Otherwise, it would be possible to detect successive coincidences when counting up and to miss coincidences and, therefore, to generate erroneous data when counting down.

Circuitry to accomplish the necessary synchronization of the RCT pulse is included in control logic 155 and shown in FIG. 10. Specifically, the circuitry includes an exclusive NOR-circuit 354, a NAND-gate 356 and an exclusive OR-circuit 358. Exclusive NOR-circuit 354 accepts as inputs the signals 1CT and 1CV, each of which is true at the time that counter 110 and register-counter 156, respectively, is enabled to count. The output of exclusive NOR-circuit 354 indicates coincidence or anticoincidence between 1CT and 1CV. This output is compared in exclusive OR-circuit 358 with the U/Dn signal which indicates whether register-counter 156 is counting up or down. The output of exclusive OR-circuit 358 is then used in conjunction with flip-flop 318 to synchronize appropriately the RCT pulse being generated.

Exclusive NOR-circuit 354 itself comprises four NAND-gates 360, 362, 364, and 366. When 1CT and 1CV both are true, the output of NAND-gate 360 is false. Since the output of NAND-gate 360 provides an input to both of NAND gates 362 and 364, the outputs of those NAND-gates both are true. As a result, NAND-gate 366 produces a false output. When 1CT and 1CV both are false, the outputs of NAND-gates 362 and 364 both are true, again producing a false output from NAND-gate 366.

If 1CT is true and 1CV false, the output from NAND-gate 360 is true. As a result, both inputs to NAND-gates 362 are true, producing a false output from that NAND-gate; the two inputs to NAND-gate 364 are respectively true and false, producing a true output from NAND-gate 364. Having one true input and one false input, the output from NAND-gate 366 is true. If 1CT is false and 1CV true, the output from NAND-gate 360 is true, the output from NAND-gate 364 is false, the output from NAND-gate 362 is true, and the output from gate 366 again is true. Thus, the output from exclusive NOR-circuit 354, on a line 368, is false when 1CT and 1CV are both logic 1 or both logic 0. Conversely, the output on line 368 is true when 1CT and 1CV are in different logical states.

The output of exclusive NOR-circuit 354 is inverted by NAND-gate 356. Thus, a true output is provided by NAND-gate 356 on a line 370, only upon coincidence between 1CT and 1CV. Similarly, a true output is present on line 368 only at anticoincidence between 1CT and 1CV. The signals on lines 368 and 370 provide two of the four inputs to exclusive OR-circuit 358, the other two inputs being the U/Dn and $\overline{U/Dn}$ signals from flip-flop 336.

Exclusive OR-circuit 358 itself comprises a pair of AND-gates 372 and 374 and NOR-gate 376. AND-gate 372 receives as inputs the U/Dn signal and the output of exclusive NOR-circuit 354 on line 368. Thus, AND-gate 372 provides an output which is true upon anticoincidence of 1CT and 1CV, when the U/Dn signal is true. Similarly, AND-gate 374 accepts as inputs the $\overline{U/Dn}$ signal and the output of AND-gate 356 on line 370. Thus, the output of AND-gate 374 is true only upon coincidence between 1CT and 1CV when the $\overline{U/Dn}$ signal is true.

NOR-gate 376 provides a false output on a line 378 if either or both of its inputs are true. Thus the output of NOR-gate 376 is true upon coincidence of 1CT and 1CV when register-counter 156 is counting up (i.e., U/Dn true) or upon anticoincidence of 1CT and 1CV when counting down (i.e., U/Dn false). The output of NOR-gate 376 is false otherwise. Thus, as noted above, the signal on line 378 is true only when the conditions desired for synchronization of the RCT pulses exist.

The signal on line 378 provides the toggle input to flip-flop 318. As a result, so along as the output of exclusive OR-circuit 358 remains true, flip-flop 318 remains set in the $\overline{Q}$ state as discussed above. However, if the desired synchronization condition should end while the pulse on line 326 still is true, the signal on line 378 will go from true to false. This transition will toggle flip-flop 318 into the Q state, causing the $\overline{Q}$ output of flip-flop 318 to go false. As a result, AND-gate 328 will be inhibited, terminating the RCT pulse.

Operation of control logic 155 with switches 300*a* and 300*b* (see FIG. 10) in the phantom position differs in only two respects from that described above for switches 300*a* and 300*b* in full line position. First, the pulses along line 304 now are supplied not by logic circuitry 302, but comprises "unit input pulses" externally supplied along line 171 via a terminal 171'. One RCT pulse is generated for each unit input pulse received on line 171 by control logic 155. Secondly, the U/Dn signal is controlled not by the error signal *e* but by an "external up-down control" signal provided along line 173. The U/Dn line 161 will be set true when the external up-down control signal on line 173 is true, and set false when the control signal is false.

Operation of the circuitry for preventing jitter in display 177 indicating the contents of external counter 175 or in an external display (not shown) indicating the contents of register-counter 156, now should be evident.

When movable member 160 of position measuring device 154 (see FIG. 7) is moved to a new position, RCT pulses will be generated which will cause the contents of register-counter 156, and hence output of function generator 145 to change in a direction tending to reduce the magnitude of the error signal from device 154. When the value of the trigonometrically related signals from function generator 145 most closely represents the new position of member 160, the error signal from device 154 will approach its minimum value. The following RCT pulse received by register-counter 156 will cause function generator 145 to produce sine and cosine values representing an overshoot position, thereby causing the sign of the error signal from position-measuring device 154 to change. As a result, the sign of the error signal *e* changes, causing control logic 155 to inhibit generation of the next RCT pulse and to reverse the state of the U/Dn signal.

When the U/Dn signal changes state, the one count delay provided by flip-flop 236' or 236 (FIG. 9) in the $-n$ or $+n$ channel of function generator 145 is transferred to the other channel. In turn, this causes the values of the trigonometric signals produced by function generator 145 to change so as to represent an undershoot position, once more resulting in a change in sign of the error signal *e*. Once again, the RCT pulse is inhibited, the state of the U/Dn signal is reversed, the one count delay channel is switched, the values of the trigonometric signals are changed, and the sign of the error signal *e* changes.

In effect, the trigonometric signals from function generator 145 oscillate between a first value representing a first position on one side of the actual position of member 160 and a second value representing a second position on the other side of member 160. This oscillation of values of the trigonometric functions continues so long as member 160 of position measuring device 154 remains at rest. Note however that while this oscillation is occurring, generation of RCT pulses is inhibited. Thus, the contents of register-counter 156 remain constant, free of jitter in all digits. Similarly, the contents of external counter 175, which contents represent the actual rest position of member 160, and the display 177, also remain constant and free of jitter in all digits.

In summary, the apparatus of FIG. 7 can be used for digital and analog conversion between data in a plurality of forms. Thus, in one mode of operation, the apparatus of FIG. 7 accepts an input digital number *n*, supplied on channel 157 in either serial or parallel form, and converts this number *n* into analog signals on lines 106 and 108. These analog rectangular wave signals are of fixed phase and exhibit pulse widths proportional to trigonometric functions of an angle $\theta=2\pi n/N$ where N is a system constant. By appropriately filtering, the rectangular wave signals can be converted to sinusoids of constant phase and having amplitudes proportional to the same trigonometric functions of $\theta$.

In another mode of operation, a pulse train supplied to the system of FIG. 7 will be converted to analog signals indicative of the number of pulses supplied. Thus, unit input pulses supplied on line 171 will cause an equal number of RCT pulses to be counted by register-counter 156. Output analog signals are produced which are trigonometrically related to the resultant contents of register-counter 156, and hence are indicative of the number of pulses supplied to the system.

In an alternative mode of operation, the system of FIG. 7 may be used to read out the position of a machine having relatively movable members to which are attached elements 152 and 160 of position measuring device 154. The error signal derived from device 154 causes register-counter 156 to operate and change the value of the trigonometrically related signals on lines 106 and 108 in a direction reducing the error signal to a small value. The resultant digital number *n* developed in register-counter 156 is representative of the position of measuring device 154 within one cycle thereof. The digital contents *n* of register-counter 156 are available in serial or parallel form via channel 157 for external utilization or display. Further, a digital indication of the machine position, not limited to within one cycle of device 154 is provided by the contents of external counter 175 and display 177.

In a related mode of operation, each RCT pulse available along line 159 represents motion through an incremental distance of the machine to which position measuring device 154 is attached. Thus, in the example described herein, each pulse appearing at the "RCT out" terminal 159' represents motion through a linear distance of 0.0001 inch or through 0.018° of arc. The direction of motion is indicated by the state of U/Dn signal available on line 161 at the "U/Dn out" terminal 161'. The "Sin O out" signal available at terminal 163' indicates passage of position-measuring device 154 through one of its cyclic zero positions.

In still another mode of operation, with switches 184*a* and 184*b* in the position shown in phantom in FIG. 7, the relatively movable members of a machine incorporating measuring device 154 can be driven to a command position indicated by a number *n* supplied to the system of FIG. 7 along input channel 157. In this mode, servomotor 170 will drive the movable machine member to the position at which the error signal from position-measuring device 154 is minimized. This position corresponds to that designated by the contents of register-counter 156 and by the trigonometrically related signals from function generator 145.

In yet another mode of operation, when switches 184*a*, 184*b* (FIG. 7), 300*a* and 300*b* (FIG. 10) all are in the phantom position, position-measuring device 154 can be driven through an increment of distance (i.e., through 0.0001 linear inch or 0.018° of rotation in the example described), for each unit input pulse supplied to the system of FIG. 7 along line 171. The direction of machine motion is determined by the state of the up-down control signal externally supplied along line 173.

In a combined mode of operation, externally supplied trigonometrically related signals may be supplied to position-measuring device 154 along lines 106 and 108 in place of those normally supplied by function generator 145. With switches 184*a* and 184*b* in the phantom position, device 154 will be driven to a position indicative of the angle represented by the externally supplied trigonometric signal. Then, with switches 184*a*, 184*b*, 300*a* and 300*b* all in the full line position, and the output of function generator 145 again connected to device 154, the contents *n* of register-counter 156 will indicate the new position of device 154, and hence will constitute a digital representation of the external trigonometrically related analog signals supplied to the system.

While the outputs of function generator 145 have been described, in conjunction with FIG. 9, in terms of sine and cosine, it is to be understood that the invention is not so limited. Thus, by appropriate selection of the phase angles (with respect to a cycle of counter 110) of the pulse trains used to operate gates 26 and 46' (see FIG. 6), trigonometric functions other than sine and cosine may be derived.

Figure 12:
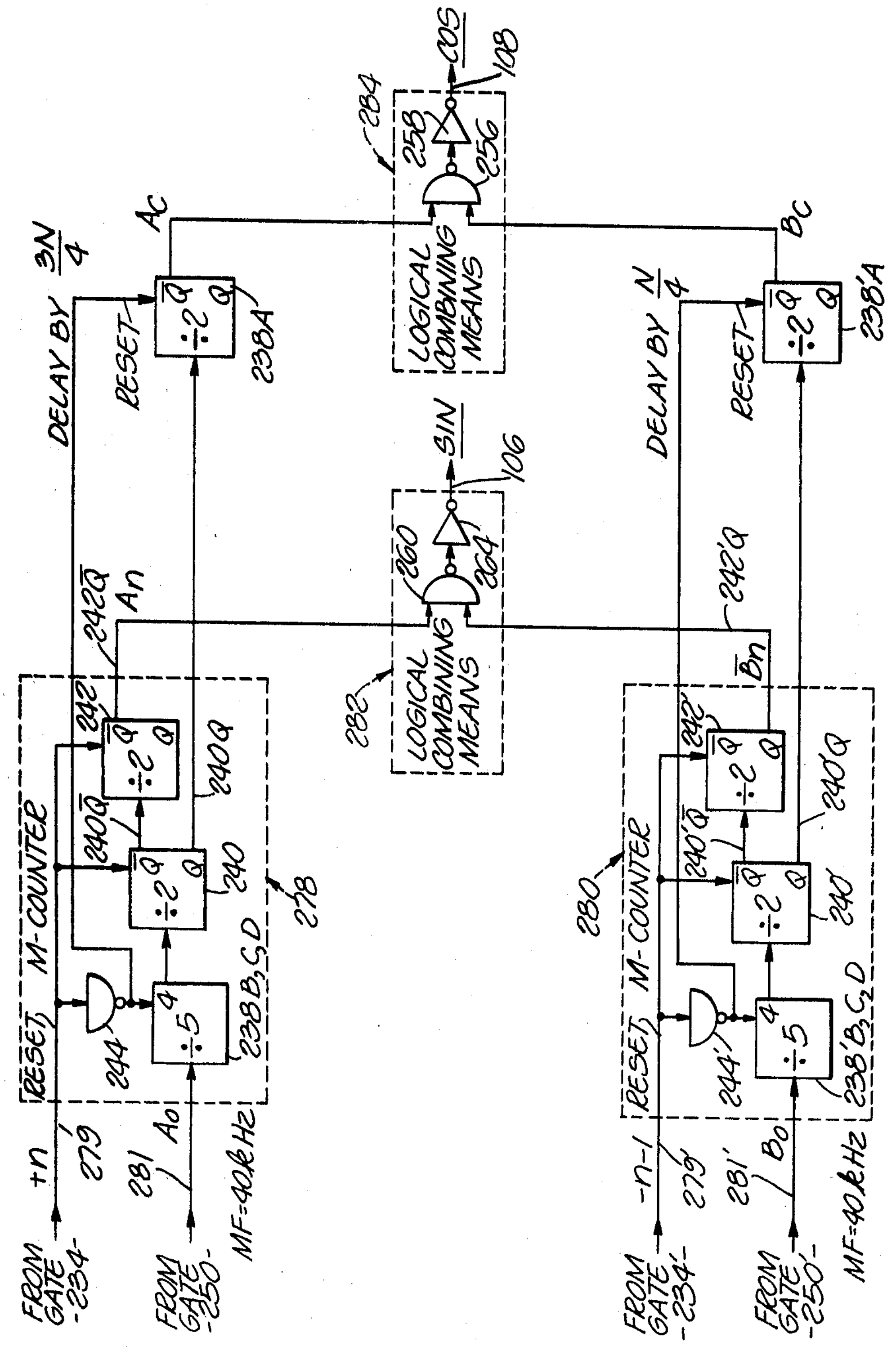
FIG. 12 is an electrical schematic diagram of a portion of the function generator also shown in FIG. 9, and wherein various components have been regrouped into functional blocks.

An alternative characterization of the operation of function generator 145 (see FIG. 9) is presented in conjunction with FIG. 12 wherein various components have been regrouped into functional blocks. Thus, counter stages 238B,C,D, flip-flop 240 and flip-flop 242 have been included in a block designated counter 278, of length M. That is, counter 278 has a capacity for counting through a range of M counts. Similarly, counter stages 238'B,C,D, flip-flop 240' and flip-flop 242' have been combined in a block designated counter 280, of length M. That is, counter 280 also has a capacity for counting through a range of M counts. The outputs 242$\bar{Q}$ and 242'Q of M-counters 278 and 280, respectively, are supplied to logical combining means 282 which includes NAND-gate 260 and inverting amplifier 264. For simplicity, the sign-inverting circuitry 262 (FIG. 9) is not shown in FIG. 12.

Counter stages 238A and 238'A are shown separated from counters 278 and 280, these stages providing delayed square wave signals AC and Bc, as discussed below. NAND-gate 256 and inverting amplifier 258 have been incorporated in a block designated logical combining means 284.

M-counter 278 (FIG. 12) receives "clock" pulses, herein designated Ao, from NAND-gate 250 (FIG. 9) along a line 281. As discussed earlier, a pulse (Ao) from gate 250 occurs each 100 counts of counter 110 (FIG. 7), starting exactly 100 counts after occurrence of a $+n$ pulse. Thus, assuming a clock CK frequency (from clock 102 in FIG. 7) of 4 MHz, the "-clock" pulses Ao will have a frequency of 40 kHz. Within M-counter 278 these Ao pulses are divided by 5 in counter sections 238 B,C,D, subsequently divided by 2 in flip-flop 240, and again divided by 2 in flip-flop 242. Thus, counter 278 accomplishes overall division by M=20 of the Ao pulses. The output from M-counter 278 is taken from the terminal 242 $\bar{Q}$ of flip-flop 242. This output, herein designated An, is typified by curve 242$\bar{A}$ in FIG. 11 and comprises a square wave of frequency F, wherein MF is the frequency of the "clock" signal Ao. In the example shown, Ao has the frequency MF=40 kHz. and M=20, thus F=2 kHz.

In like manner, M-counter 280 receives input pulses Bo at frequency MF=40 kHz. from NAND-gate 250' (FIG. 9) along a line 281'. As discussed earlier, when the $U/D_n$ signal is false, a pulse (Bo) from gate 250' occurs each 100 counts of counter 110 (FIG. 7), starting exactly 101 counts after occurrence of a $-n-1$ pulse on line 279'. M-counter 280 also divides the input signal by M=20, and thus produces an output at terminal 242'Q of flip-flop 242' which comprises a square wave of frequency F=2 kHz. This output signal from M-counter 280 herein is designated $\bar{B}n$; note that $\bar{B}n$ is taken from the Q terminal of flip-flop 242' whereas An is taken from the $\bar{Q}$ terminal of flip-flop 242 in M-counter 278.

M-counters 278 and 280 each are operatively cyclically stepped by the "clock" pulses Ao and Bo through the sequential counts in a count range of M=20 counts. Once each cycle counters 278 and 280 are reset, respectively, by the $+n$ and $-n-1$ pulses received from NAND-gates 234 and 234' along lines 279 and 279'. As should be apparent from FIG. 12, the $+n$ pulse resets M-counter 278 to a count of 19, so that the next pulse Ao from gate 250 will cause the contents of counter 278 to go to zero and will cause a negative going transition of the output signal 242$\bar{Q}$ (An). Similarly, the $-n-1$ signal resets M-counter 280 to a count of 19 so that the next pulse Bo will cause the contents of counter 280 to go to zero and will cause a positive going transition of the output signal 242'Q ($\bar{B}n$). Recall that the initial Ao pulse occurs exactly 100 counts (of counter 110) after occurrence of the $+n$ signal, and that the initial Bo pulse occurs exactly 101 counts (of counter 110) after occurrence of the $-n-1$ signal.

It is thus apparent that the $+n$ and $-n-1$ reset pulses and the initial Ao and Bo pulses together function to establish the relative phase or phase difference between the An and $\bar{B}n$ counter output square wave signals. This difference in phase represents the digital value $2n$ wherein, as discussed above, $n$ is a digital number specifying an angle $\theta=2\pi n/N$, and wherein, in the example described, N=2,000.

As evident in FIG. 11, the square waves 242$\bar{Q}$ (An) and 242'Q ($\bar{B}n$) have logic 1 (or logic 0) portions which overlap in time by an amount corresponding to the phase difference between An and $\bar{B}n$. NAND-gate 260, in logical combining means 282, provides a logic 0 output whenever the logic 1 portions of An and $\bar{B}n$ overlap. The gate 260 output is inverted by amplifier 264 to provide on line 106 a rectangular wave signal having a pulse width proportional to the relative phase of the signals An and $\bar{B}n$. Since this relative phase in turn is indicative of $2n$, where $n$ is the input digital number stored in register-counter 156 (see FIG. 7), the pulse width of the analog (SINE) output signal 106' will be proportional to sin $\theta$, wherein $\theta=2\pi n/N$. This of course, is illustrated by curves 242$\bar{Q}$, 242'Q and 106' of FIG. 11.

To summarize, apparatus for generation of an analog rectangular wave signal 106' having a frequency F and a pulse width proportional to sin $\theta$, wherein $\theta=2\pi n/N$, includes first and second counters 278 and 280 each of length M, each connected to a source of pulses of frequency MF, and each operative to be stepped, by the source, cyclically through a range of M counts. Control means, herein comprising means to reset counters 278 and 280 in response to the $+n$ and $-n$ pulses, respectively, establishes a constant phase difference between the square wave output signals produced by counters 278 and 280. Logical combining means 282, including means 260,264 responsive to overlapping logic 1 or logic 0 portions of the square wave output signals An and $\bar{B}n$ from counters 278 and 280, produces a first rectangular wave analog signal 106' having fixed phase and having a pulse width indicative of the relative phase of An and $\bar{B}n$. Since this relative phase itself is proportional to $2n$ as discussed above, the pulse width itself is proportional to sin $\theta$, wherein $\theta=2\pi n/N$.

Generation of a rectangular wave analog signal proportional to cosine $\theta$, where $\theta=2\pi n/N$, is accomplished by providing third and fourth square wave signals, herein designated Ac and Bc which are of the same frequency F as square waves An and $\bar{B}n$, but which respectively lag An and $\bar{B}n$ by 270° and 90°. That is, Ac comprises a square wave signal of frequency F which lags An by a period of time equal to ¾ of a cycle of F (herein equal to the time required by counter 110 of FIG. 7 to step through 3N/4 counts). Similarly, Bc is a square wave of frequency F which lags $\bar{B}n$ by a period of time equal to ¼ cycle of F (herein equal to the time required for counter 110 to step through a count of N/4).

To facilitate generation of the square waves Ac and Bc, counter stages 238A and 238'A respectively receive the outputs 240Q and 240'Q of flip-flops 240 and 240'. These signals, which are square waves each having the frequency 2F, are divided by counter stages 238A and 238'A, respectively, to provide the desired square waves Ac and Bc. Reference to FIG. 11 shows that Ac (238A) is a square wave identical in frequency to signal An (242$\bar{Q}$), but lagging An by a count (in counter 110) of 1,500, equal to 3N/4 when N=2,000. Similarly, square wave Bc (238'A) is identical in frequency to $\bar{B}n$ (242'Q) but lags that signal by a count (in counter 110) of 500, equal to N/4 when N=2,000.

The overlapping portions of the Ac and Bc signals are combined by logical combining means 284, including NAND-gate 256 and amplifier 258, to provide on line 108 (FIG. 12) an analog output signal 108' (FIG. 11) comprising a rectangular wave having a pulse width proportional to the phase difference between Ac and Bc. Because of the phase relationships described between An and Ac, and between $\bar{B}n$ and Bc, the pulse width of signal 108' is proportional to cosine $\theta$, wherein $\theta=2\pi n/N$.

To summarize, apparatus for generation of a rectangular wave signal having pulse width proportional to cosine $\theta$, wherein $\theta=2\pi n/N$, may be characterized as including a first delay means (counter stage 238A) for providing a square wave signal Ac of frequency F but lagging square wave An by 270°, a second delay means (counter stage 238'A) for providing a square wave signal Bc of frequency F but lagging $\bar{B}n$ by 90° and logical combining means 284, including gate means 256 and inverting amplifier 258 responsive to Ac and Bc, for producing a rectangular wave signal of fixed phase but having a pulse width proportional to the difference in phase between Ac and Bc, this pulse width being proportional to cosine $\theta$.

While the invention has been described with respect to several physical embodiments constructed in accordance therewith, it will be apparent to those skilled in the art that various modifications and improvements may be made without departing from the scope and spirit of the invention.

I claim:

1. Apparatus for converting data between digital and analog forms, said apparatus comprising:

a counter adapted to pass cyclically through a range of counts, a register-counter adapted to store said digital data, means responsive to the contents of said register-counter and to the count of said counter to develop a first train of pulses occurring at a phase of the counter cycle leading a reference phase of said counter cycle, means responsive to the contents of said register-counter and to the count of said counter to develop a second train of pulses at a phase of the counter cycle lagging said reference phase, means to cause a first analog signal to be produced from the pulses in said first and second trains, means, cooperating with said counter and said register-counter, for producing a second analog signal, said first and second analog signals each being of substantially fixed phase and each having a magnitude indicative of said digital data, said analog signals being trigonometrically related, position measuring transformer means having relatively movable and relatively stationary members inductively coupled together whereby a signal in one winding member is inductively coupled to the other winding member as a function of the relative positions of the members, one of said winding members receiving said analog signals as inputs and comprising windings having a geometric spacing corresponding to the trigonometric relationship of said input signals, the said other winding producing an error signal indicative of the relative position of said members, control means for changing the values of said trigonometrically related analog signals in response to said error signal, switch means connected to receive said error signal from the other winding member, said switch means having at least two output positions, and servo drive means connected to one output position of said switch means and including means responsive to said error signal from the other winding member when said switch means is in one of said output positions for driving said relatively movable member until the inductive coupling between said winding members is substantially zero, said means cooperating with said register-counter being connected to the other position of said switch means and being responsive to said error signal from the other winding member when said switch means is in said other position.

2. A trigonometric function generator comprising, in combination:

a binary-coded decimal counter adapted to advance repetitively through N counts, a register adapted to store a binary coded decimal number $n$, first comparator means providing pulses of a first set upon detection of coincidence in each decimal digit between the contents of said counter and the contents of said register, second comparator means providing pulses of a second set upon detection of coincidence in each decimal digit between (a) the 9's complement of the contents of one of said counter and said register, and (b) the contents of the other of said counter and said register, first generator means to cause first analog signals to be generated from pulses of said first and second sets, said first analog signals being of substantially fixed phase and having a magnitude representative of a first trigonometric function or an angle $\theta=2\pi n/N$, second generator means to cause second analog signals to be generated from pulses of said first and second sets, said second analog signals being of substantially fixed phase and having a magnitude representative of a second trigonometric function of said angle $\theta=2\pi n/N$, said first and second trigonometric functions being sine and cosine, respectively, said first generator means comprising:

a first gate opened $-n$ pulses of said second set indicating detection by said second comparator means of simultaneous coincidence in all digits and closed by $+n$ pulses of said first set indicating detection by said first comparator means of simultaneous coincidence in all digits, and said second generator means comprising:

first means for delaying said $+n$ pulses by a period of time substantially equal to the time taken by said counter to advance through 3N/4 counts, second means for delaying said $-n$ pulses by a period of time substantially equal to the time taken by said counter to advance through N/4 counts, and a second gate opened by said delayed $+n$ pulses and closed by said delayed $-n$ pulses.

3. A function generator according to claim 2 wherein said first means for delaying comprises a first delay counter reset upon occurrence of said $+n$ pulses and advanced by pulses of said first set indicative of coincidence in some but not all digits, and wherein said second means for delaying comprises a second delay counter reset upon occurrence of said $-n$ pulses and advanced by pulses of said second set indicative of coincidence in some but not all digits.

4. A function generator according to claim 3 wherein N=2,000, wherein said first delay counter is advanced by pulses of said first set indicative of simultaneous units digit and tens digit coincidence, said first delay counter producing an output when 15 such advance pulses have been counted therein, and wherein said second delay counter is advanced by pulses of said second set indicative of simultaneous units digit and tens digit coincidence, said second delay counter producing an output when five such advance pulses have been counted therein.

5. A function generator according to claim 3 wherein N=2,000, said function generator further comprising preliminary delay means for delaying said $+n$ pulses and said $-n$ pulses by a period of time substantially equal to the time taken by said counter to advance through 100 counts, wherein said first gate is opened and closed respectively by said preliminarily delayed $-n$ pulses and $+n$ pulses, and wherein said first and second delay counters respectively are reset by said preliminarily delayed $+n$ pulses and $-n$ pulses.

6. A function generator according to claim 2 further comprising means for initially delaying said $-n$ pulses by a period of time substantially equal to the time taken by said counter to advance through one count, said first gate and said second means for delaying receiving said initially delayed $-n$ pulses.

7. A position control and measuring system comprising:

a position-measuring transformer having relatively movable, inductively related elements responsive to trigonometrically related signals and the relative position of said elements to provide an error signal, a converter responsive to a digital count including a first selectable input for changing said digital count until said error signal is substantially zero and including means for generating said trigonometrically related signals in response to said digital count, a servo circuit including a second selectable input for mechanically driving the movable element of said position-measuring transformer until said error signal is substantially zero, switching means for selectively connecting, during a first mode, said error signal to said first input to change said digital count to correspond to said relative position and for selectively connecting, during a second mode, said error signal to said second input to change said relative position to correspond with said digital count, means for reading out said digital count during said first mode as a measure of said relative position; and means for supplying said digital count during said second mode as a command for said relative position.

8. A position control and measuring system comprising:

a position-measuring transformer having relatively movable, inductively related elements for attachment to relatively movable parts of a machine, respectively, one of said elements having an input of trigonometrically related signals from a digital-to-analog converter and the other of said elements having an output of an error signal depending on the discrepancy between the value of said input and the position of the movable machine part and its associated element, means providing a digital command signal, a servo circuit, switching means operative at times to connect said command signal means as input to said digital-to-analog converter and connect said position-measuring transformer in said servo circuit to position the movable machine part in accordance with said command signal, said switching means being operative at other times to disconnect said command signal and said servo circuit and connect the error signal to form an input to a phase detector supplying an error-signal-derived digital input to (a) said digital-to-analog converter to reduce the error signal to zero, and to (b) a reversible counter, and a readout associated with said counter, said readout providing a digital indication of the instantaneous relative position of said elements.

9. A position control and measuring system comprising:

a position-measuring transformer having relatively movable, inductively related elements for attachment to relatively movable parts of a machine, respectively, one of said elements having an input of trigonometrically related signals from a digital-to-analog converter having an input from a reversible counter and the other of said elements having an output of an error signal depending on the discrepancy between the value of said input and the position of the movable machine part and its associated element, means providing a digital command signal, a servo circuit, switching means operative at times to connect said command signal means as input to said reversible counter and connect said position measuring transformer in said servo circuit to position the movable machine part in accordance with said command signal, said switching means being operative at other times to disconnect said command signal and said servo circuit and connect the error signal to form an input to a phase detector supplying an error-signal-derived digital input to said reversible counter to reduce the error signal to zero, and a readout associated with said reversible counter, said readout providing a digital indication of the instantaneous relative position of said elements.

10. In a position-measuring system for the relatively movable members of a machine wherein said movable member is suitably driven, the combination of a position-measuring device having a stationary element for attachment to a stationary machine member and having a movable element for attachment to a movable machine member, said elements being inductively related, and wherein a logic circuit supplies trigonometrically related signals to said position-measuring device, said position-measuring device supplying an error signal depending on a comparison of the relative displacement of said inductively related elements with the input of said trigonometrically related signals to said position-measuring device, means for changing the production of said trigonometrically related signals in response to said error signal, an input of a digital number, said logic circuit acting to convert said number into corresponding analog values of said trigonometrically related signals, switch means connected to receive said error signal from said position-measuring device, said switch means having at least two output positions, first means, connected to receive said error signal when said switch means is in one output position, for driving said relatively movable members in response to said error signal to relative positions indicative of said digital input number, and second means, connected to receive said error signal when said switch means is in the other output position, for changing the production of said trigonometrically related signals in a direction reducing said error signal to a small value, said second means developing a count constituting a digital indication of the relative positions of said machine members.

11. In a function generator of the type utilizing "positive" pulses generated by coincidence between the contents of a counter advancing at a constant rate and a number contained in a control counter, and "negative" pulses generated by coincidence between said contents and the nine's complement of said number, said "positive" and "negative" pulses being combined to generate a first function, said "positive" and "negative" pulses being delayed in first and second delay counters, respectively, and then combined to produce another function, that improvement comprising means for recognizing "positive" coincidences between selected digits of said contents and corresponding digits of said number, and for recognizing "negative" coincidences between said like selected digits of said contents and corresponding digits of the nine's complement of said number, and means for advancing said first and second delay counters, respectively, in response to said recognized "positive" and "negative" coincidences.

12. A function generator according to claim 11 wherein said counters comprise decade counters, and wherein said selected digits are the tens and units digits.

13. Apparatus for converting data between digital and analog forms, said apparatus comprising:

a counter adapted to pass cyclically through a range of counts, a register-counter adapted to store said digital data, means responsive to the contents of said register-counter and to the count of said counter to develop a first train of pulses occurring at a phase of the counter cycle leading a reference phase of said counter cycle, means responsive to the contents of said register-counter and to the count of said counter to develop a second train of pulses at a phase of the counter cycle lagging said reference phase, means to cause a first analog signal to be produced from the pulses in said first and second trains, means, cooperating with said counter and said register-counter, for producing a second analog signal, said first and second analog signals each being of substantially fixed phase and each having a magnitude indicative of said digital data, said analog signals being trigonometrically related, position-measuring transformer means having relatively movable and relatively stationary members inductively coupled together whereby a signal in one winding member is inductively coupled to the other winding member as a function of the relative positions of the members, one of said winding members receiving said analog signals as inputs and comprising windings have a geometric spacing corresponding to the trigonometric relationship of said input signals, the said other winding producing an error signal indicative of the relative position of said members, control means for changing the values of said trigonometrically related analog signals in response to said error signal, and means, responsive to said error signal, for producing pulses each indicative of displacement of said position-measuring device through an increment of distance.

14. Apparatus for converting data between digital and analog forms, said apparatus comprising:

a counter adapted to pass cyclically through a range of counts, a register-counter adapted to store said digital data, means responsive to the contents of said register-counter and to the count of said counter to develop a first train of pulses occurring at a phase of the counter cycle leading a reference phase of said counter cycle, means responsive to the contents of said register-counter and to the count of said counter to develop a second train of pulses at a phase of the counter cycle lagging said reference phase, means to cause a first analog signal to be produced from the pulses in said first and second trains, means, cooperating with said counter and said register-counter, for producing a second analog signal, said first and second analog signals each being of substantially fixed phase and each having a magnitude indicative of said digital data, said analog signals being trigonometrically related, position-measuring transformer means having relatively movable and relatively stationary members inductively coupled together whereby a signal in one winding member is inductively coupled to the other winding member as a function of the relative positions of the members, one of said winding members receiving said analog signals as inputs and comprising windings having a geometric spacing corresponding to the trigonometric relationship of said input signals, the said other winding producing an error signal indicative of the relative position of said members, control means for changing the values of said trigonometrically related analog signals in response to said error signal, and means, responsive to said error signal, for providing a digital control signal the logical state of which represents the direction of positional error of said position-measuring device.

15. Apparatus for converting data between digital and analog forms, said apparatus comprising:

a counter adapted to pass cyclically through a range of counts, a register-counter adapted to store said digital data, means responsive to the contents of said register-counter and to the count of said counter to develop a first train of pulses occurring at a phase of the counter cycle leading a reference phase of said counter cycle, means responsive to the contents of said register-counter and to the count of said counter to develop a second train of pulses at a phase of the counter cycle lagging said reference phase, means to cause a first analog signal to be produced from the pulses in said first and second trains, means, cooperating with said counter and said register-counter, for producing a second analog signal, said first and second analog signals each being of substantially fixed phase and each having a magnitude indicative of said digital data, said analog signals being trigonometrically related, position-measuring transformer means having relatively movable and relatively stationary members inductively coupled together whereby a signal in one winding member is inductively coupled to the other winding member as a function of the relative positions of the members, one of said winding members receiving said analog signals as inputs and comprising windings having a geometric spacing corresponding to the trigonometric relationship of said input signals, the said other winding producing an error signal indicative of the relative position of said members, control means for changing the values of said trigonometrically related analog signals in response to said error signal, said control means comprising means for changing the contents of said register-counter in response to said error signal, thereby causing the values of said trigonometrically related signals to be changed in a direction reducing said error signal to a small value, said means for changing the contents of said register-counter comprising means, responsive to the presence of said error signal, for generating counter toggle pulses to operate said register-counter, and said counter toggle pulses being generated at a rate depending on the magnitude of said error signal.

16. Apparatus for converting data between digital and analog forms, said apparatus comprising:

a counter adapted to pass cyclically through a range of counts, a register-counter adapted to store said digital data, a means responsive to the contents of said register-counter and to the count of said counter to develop a first train of pulses occurring at a phase of the counter cycle leading a reference phase of said counter cycle, means responsive to the contents of said register-counter and to the count of said counter to develop a second train of pulses at a phase of the counter cycle lagging said reference phase, means to cause a first analog signal to be produced from the pulses in said first and second trains, means, cooperating with said counter and said register-counter, for producing a second analog signal, said first and second analog signals each being of substantially fixed phase and each having a magnitude indicative of said digital data, said analog signals being trigonometrically related, position-measuring transformer means having relatively movable and relatively stationary members inductively coupled together whereby a signal in one winding member is inductively coupled to the other winding member as a function of the relative positions of the members, one of said winding members receiving said analog signals as inputs and comprising windings having a geometric spacing corresponding to the trigonometric relationship of said input signals, the said other winding producing an error signal indicative of the relative position of said members, servo drive means connected to receive said error signal, and including means responsive to said error signal for driving said relatively movable member until the inductive coupling between said winding members is substantially zero, the resultant relative position of said members thus being controlled by and indicative of the digital contents of said register-counter, and means for entering said digital data into said register-counter.

17. Apparatus for converting data between digital and analog forms, said apparatus comprising:

a counter adapted to pass cyclically through a range of counts, a register-counter adapted to store said digital data, means responsive to the contents of said register-counter and to the count of said counter to develop a first train of pulses occurring at a phase of the counter cycle leading a reference phase of said counter cycle, means responsive to the contents of said register-counter and to the count of said counter to develop a second train of pulses at a phase of the counter cycle lagging said reference phase, means to cause a first analog signal to be produced from the pulses in said first and second trains, means, cooperating with said counter and said register-counter, for producing a second analog signal, said first and second analog signals each being of substantially fixed phase and each having a magnitude indicative of said digital data, said analog signals being trigonometrically related, position-measuring transformer means having relatively movable and relatively stationary members inductively coupled together whereby a signal in one winding member is inductively coupled to the other winding member as a function of the relative positions of the members, one of said winding members receiving said analog signals as inputs and comprising windings having a geometric spacing corresponding to the trigonometric relationship of said input signals, the said other winding producing an error signal indicative of the relative position of said members, and servo drive means connected to receive said error signal, and including means responsive to said error signal for driving said relatively movable member until the inductive coupling between said winding members is substantially zero, the resultant relative position of said members thus being controlled by and indicative of the digital contents of said register-counter, said register-counter being advanced by externally supplied unit input pulses, said relatively movable member being driven through an increment of distance in response to each of said unit input pulses.

18. Apparatus according to claim 17 wherein said register-counter is incremented or decremented by said unit input pulses depending on the state of an externally supplied up-down control signal, said state thereby determining the direction in which said relatively movable member is driven.

19. Apparatus for converting a digital number $n$ to which there corresponds an angle $\theta=360n/N$ degrees, wherein N is a constant, into analog signals indicative of said number, said apparatus comprising:

means for generating a first train of pulses, each pulse leading by $\theta°$ a reference phase cyclically recurring every 360°, means for generating a second train of pulses, each pulse lagging by $\theta°$ said cyclically recurring reference phase, first means, including a gate closed and opened respectively by pulses of said first and second trains, for producing a first rectangular wave signal having a pulse width indicative of a first trigonometric function of said angle $\theta$, second means, including a gate opened and closed respectively by delayed pulses of said first and second trains, for producing a second rectangular wave signal having a pulse width indicative of a second trigonometric function of said angle $\theta$, a counter adapted to advance repetitively through N counts in a cycle corresponding to 360°, a register adapted to store said digital number $n$, and wherein said means for generating a first train comprises a first coincidence detector providing an output pulse each time the contents of said counter equal the contents of said register, and wherein said means for generating a second train comprises a translator providing a signal which is a function of the complement of the contents of one of said counter and register, and a second coincidence detector providing an output pulse each time said signal equals the contents of the other of said counter and register, and means for entering said digital number$n$ into said register, said register itself comprising a counter advanced by serially supplied unit input pulses, said counter being incremented or decremented by said unit input pulses depending on the state of an externally supplied up-down control signal.

* * * * *